United States Patent
Tran et al.

(10) Patent No.: US 10,431,265 B2
(45) Date of Patent: Oct. 1, 2019

(54) ADDRESS FAULT DETECTION IN A FLASH MEMORY SYSTEM

(71) Applicant: Silicon Storage Technology, Inc., San Jose, CA (US)

(72) Inventors: Hieu Van Tran, San Jose, CA (US); Xian Liu, Sunnyvale, CA (US); Nhan Do, Saratoga, CA (US)

(73) Assignee: SILICON STORAGE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 15/467,174

(22) Filed: Mar. 23, 2017

(65) Prior Publication Data

US 2018/0277174 A1 Sep. 27, 2018

(51) Int. Cl.
| | |
|---|---|
| *G11C 16/06* | (2006.01) |
| *G11C 7/10* | (2006.01) |
| *G11C 8/12* | (2006.01) |
| *H01L 21/28* | (2006.01) |
| *H01L 27/11521* | (2017.01) |
| *G11C 16/08* | (2006.01) |
| *G11C 29/02* | (2006.01) |
| *H01L 29/423* | (2006.01) |
| *H01L 29/66* | (2006.01) |
| *H01L 29/788* | (2006.01) |
| *G11C 16/04* | (2006.01) |
| *G11C 8/08* | (2006.01) |
| *G11C 8/10* | (2006.01) |
| *G11C 29/12* | (2006.01) |
| *H01L 27/11524* | (2017.01) |

(52) U.S. Cl.
CPC .............. *G11C 7/1006* (2013.01); *G11C 8/12* (2013.01); *G11C 16/08* (2013.01); *G11C 29/024* (2013.01); *H01L 21/28273* (2013.01); *H01L 27/11521* (2013.01); *G11C 8/08* (2013.01); *G11C 8/10* (2013.01); *G11C 16/0425* (2013.01); *G11C 2029/1202* (2013.01); *G11C 2029/1204* (2013.01); *H01L 27/11524* (2013.01); *H01L 29/42328* (2013.01); *H01L 29/66825* (2013.01); *H01L 29/7883* (2013.01)

(58) Field of Classification Search
CPC ... G11C 7/1006; G11C 8/12; H01L 21/28273; H01L 27/11521; H01L 29/42328; H01L 29/66825; H01L 29/7883
USPC ...................................................... 365/185.22
See application file for complete search history.

(56) References Cited

U.S. PATENT DOCUMENTS

| | | | |
|---|---|---|---|
| 6,083,792 A * | 7/2000 | Sung ................. | H01L 29/42324 257/E21.209 |
| 6,111,801 A | 8/2000 | Brady | |
| 6,327,187 B1 | 12/2001 | Bergemont et al. | |

(Continued)

*Primary Examiner* — Huan Hoang
(74) *Attorney, Agent, or Firm* — DLA Piper LLP US

(57) ABSTRACT

A system and method are disclosed for performing address fault detection in a flash memory system. An address fault detection array is used to confirm that an activated word line or bit line is the word line or bit line that was actually intended to be activated based upon the received address, which will identify a type of fault where the wrong word line or bit line is activated. The address fault detection array also is used to indicate whether more than one word line or bit line was activated, which will identify a type of fault where two or more word lines or bit lines are activated.

55 Claims, 38 Drawing Sheets

(56) References Cited

U.S. PATENT DOCUMENTS

| | | | |
|---|---|---|---|
| 7,868,375 B2 | 1/2011 | Liu | |
| 8,379,468 B2* | 2/2013 | Ramaraju | G11C 29/024 |
| | | | 365/200 |
| 8,625,365 B2 | 1/2014 | Sanjeevarao | |
| 2006/0273378 A1* | 12/2006 | Gao | G11C 16/0483 |
| | | | 257/326 |
| 2007/0153596 A1 | 7/2007 | Kilian et al. | |
| 2008/0106945 A1* | 5/2008 | Jo | G11C 7/062 |
| | | | 365/185.21 |
| 2012/0261736 A1 | 10/2012 | Hsu et al. | |
| 2014/0029363 A1 | 1/2014 | Lim | |
| 2015/0243368 A1 | 8/2015 | Remington | |
| 2015/0332750 A1 | 11/2015 | Dong et al. | |

* cited by examiner

Address Fault Type 1: Wrong Row Selected

Address Fault Type 2: Multiple Rows Selected

Address Fault Type 1: Wrong Row Selected

Address Fault Type 2: Multiple Rows Selected

FIGURE 17 (PRIOR ART)

| Address in A[3:0] | | | | Encoded Address Bits EB[3:0] | | | |
|---|---|---|---|---|---|---|---|
| A3 | A2 | A1 | A0 | EA3 | EA2 | EA1 | EA0 |
| 0 | 0 | 0 | 0 | 0 | 0 | 0 | 0 |
| 0 | 0 | 0 | 1 | 0 | 0 | 0 | 1 |
| 0 | 0 | 1 | 0 | 0 | 0 | 1 | 0 |
| 0 | 0 | 1 | 1 | 0 | 0 | 1 | 1 |
| 0 | 1 | 0 | 0 | 0 | 1 | 0 | 0 |
| 0 | 1 | 0 | 1 | 0 | 1 | 0 | 1 |
| 0 | 1 | 1 | 0 | 0 | 1 | 1 | 0 |
| 0 | 1 | 1 | 1 | 0 | 1 | 1 | 1 |
| 1 | 0 | 0 | 0 | 1 | 0 | 0 | 0 |
| 1 | 0 | 0 | 1 | 1 | 0 | 0 | 1 |
| 1 | 0 | 1 | 0 | 1 | 0 | 1 | 0 |
| 1 | 0 | 1 | 1 | 1 | 0 | 1 | 1 |
| 1 | 1 | 0 | 0 | 1 | 1 | 0 | 0 |
| 1 | 1 | 0 | 1 | 1 | 1 | 0 | 1 |
| 1 | 1 | 1 | 0 | 1 | 1 | 1 | 0 |
| 1 | 1 | 1 | 1 | 1 | 1 | 1 | 1 |

FIGURE 18A

| Address In A[3:0] | | | | Encoded Address Bits EB[3:0] | | | | |
|---|---|---|---|---|---|---|---|---|
| A3 | A2 | A1 | A0 | EA3 | EA2 | EA1 | EA0 | PB |

FIGURE 18B

| Address in A[3:0] | | | | Encoded Address Bits EB[3:0] | | | | | |
|---|---|---|---|---|---|---|---|---|---|
| A3 | A2 | A1 | A0 | EA3 | EA2 | EA1 | EA0 | PB | MRD |
| 0 | 0 | 0 | 0 | 0 | 0 | 0 | 0 | 0 | 1 |
| 0 | 0 | 0 | 1 | 0 | 0 | 0 | 1 | 0 | 1 |
| 0 | 0 | 1 | 0 | 0 | 0 | 1 | 0 | 0 | 1 |
| 0 | 0 | 1 | 1 | 0 | 0 | 1 | 1 | 0 | 1 |
| 0 | 1 | 0 | 0 | 0 | 1 | 0 | 0 | 0 | 1 |
| 0 | 1 | 0 | 1 | 0 | 1 | 0 | 1 | 0 | 1 |
| 0 | 1 | 1 | 0 | 1 | 0 | 0 | 0 | 1 | 1 |
| 0 | 1 | 1 | 1 | 1 | 0 | 0 | 0 | 0 | 1 |
| 1 | 0 | 0 | 0 | 1 | 0 | 0 | 1 | 0 | 1 |
| 1 | 0 | 0 | 1 | 1 | 0 | 1 | 1 | 1 | 1 |
| 1 | 0 | 1 | 0 | 1 | 1 | 0 | 0 | 0 | 1 |
| 1 | 0 | 1 | 1 | 0 | 0 | 1 | 0 | 1 | 1 |
| 1 | 1 | 0 | 0 | 0 | 0 | 0 | 1 | 1 | 1 |
| 1 | 1 | 0 | 1 | 0 | 0 | 0 | 0 | 1 | 1 |

FIGURE 19

| Address in A[3:0] | | | | Encoded Address Bits EA[3:0],EB[3:0] | | | | | | | |
|---|---|---|---|---|---|---|---|---|---|---|---|
| A3 | A2 | A1 | A0 | EA3 | EB3 | EA2 | EB2 | EA1 | EB1 | EA0 | EB0 |
| 0 | 0 | 0 | 0 | 0 | 1 | 0 | 1 | 0 | 1 | 0 | 1 |
| 0 | 0 | 0 | 1 | 0 | 1 | 0 | 1 | 0 | 1 | 1 | 0 |
| 0 | 0 | 1 | 0 | 0 | 1 | 0 | 1 | 1 | 0 | 0 | 1 |
| 0 | 0 | 1 | 1 | 0 | 1 | 0 | 1 | 1 | 0 | 1 | 0 |
| 0 | 1 | 0 | 0 | 0 | 1 | 1 | 0 | 0 | 1 | 0 | 1 |
| 0 | 1 | 0 | 1 | 0 | 1 | 1 | 0 | 0 | 1 | 1 | 0 |
| 0 | 1 | 1 | 0 | 0 | 1 | 1 | 0 | 1 | 0 | 0 | 1 |
| 0 | 1 | 1 | 1 | 0 | 1 | 1 | 0 | 1 | 0 | 1 | 0 |
| 1 | 0 | 0 | 0 | 1 | 0 | 0 | 1 | 0 | 1 | 0 | 1 |
| 1 | 0 | 0 | 1 | 1 | 0 | 0 | 1 | 0 | 1 | 1 | 0 |
| 1 | 0 | 1 | 0 | 1 | 0 | 0 | 1 | 1 | 0 | 0 | 1 |
| 1 | 0 | 1 | 1 | 1 | 0 | 0 | 1 | 1 | 0 | 1 | 0 |
| 1 | 1 | 0 | 0 | 1 | 0 | 1 | 0 | 0 | 1 | 0 | 1 |
| 1 | 1 | 0 | 1 | 1 | 0 | 1 | 0 | 0 | 1 | 1 | 0 |
| 1 | 1 | 1 | 0 | 1 | 0 | 1 | 0 | 1 | 0 | 0 | 1 |
| 1 | 1 | 1 | 1 | 1 | 0 | 1 | 0 | 1 | 0 | 1 | 0 |

FIGURE 20

| V<7:0> | | AY[2] | AY[1] | AY[0] | | AYA[2] | AYB[2] | AYA[1] | AYB[1] | AYA[0] | AYB[0] |
|---|---|---|---|---|---|---|---|---|---|---|---|
| WLY[0]= | V[0] | 0 | 0 | 0 | | 0 | 1 | 1 | 1 | 1 | 1 |
| WLY[1]= | V[1] | 0 | 0 | 1 | | 0 | 1 | 0 | 1 | 0 | 0 |
| WLY[2]= | V[2] | 0 | 1 | 0 | | 0 | 1 | 1 | 0 | 1 | 1 |
| WLY[3]= | V[3] | 0 | 1 | 1 | | 0 | 1 | 1 | 0 | 0 | 0 |
| WLY[4]= | V[4] | 1 | 0 | 0 | | 1 | 0 | 0 | 1 | 1 | 1 |
| WLY[5]= | V[5] | 1 | 0 | 1 | | 1 | 0 | 0 | 1 | 1 | 0 |
| WLY[6]= | V[6] | 1 | 1 | 0 | | 1 | 0 | 1 | 0 | 0 | 1 |
| WLY[7]= | V[7] | 1 | 1 | 1 | | 1 | 0 | 1 | 0 | 1 | 0 |

| T<3:0> | | AY[4] | AY[0] | | AYA[4] | AYB[4] | AYA[3] | AYB[3] |
|---|---|---|---|---|---|---|---|---|
| WLY[8]= | T[0] | 0 | 0 | | 0 | 1 | 0 | 1 |
| WLY[9]= | T[1] | 0 | 1 | | 0 | 1 | 1 | 0 |
| WLY[10]= | T[2] | 1 | 0 | | 1 | 0 | 0 | 1 |
| WLY[11]= | T[3] | 1 | 1 | | 1 | 0 | 1 | 0 |

ADDRESS FAULT DETECTION IN A FLASH MEMORY SYSTEM

TECHNICAL FIELD

A system and method are disclosed for performing address fault detection in a flash memory system.

BACKGROUND OF THE INVENTION

Non-volatile memory cells are well known in the art. One prior art non-volatile split gate memory cell 10, which contains five terminals, is shown in FIG. 1. Memory cell 10 comprises semiconductor substrate 12 of a first conductivity type, such as P type. Substrate 12 has a surface on which there is formed a first region 14 (also known as the source line SL) of a second conductivity type, such as N type. A second region 16 (also known as the drain line) also of N type is formed on the surface of substrate 12. Between the first region 14 and the second region 16 is channel region 18. Bit line BL 20 is connected to the second region 16. Word line WL 22 is positioned above a first portion of the channel region 18 and is insulated therefrom. Word line 22 has little or no overlap with the second region 16. Floating gate FG 24 is over another portion of channel region 18. Floating gate 24 is insulated therefrom, and is adjacent to word line 22. Floating gate 24 is also adjacent to the first region 14. Floating gate 24 may overlap the first region 14 to provide coupling from the first region 14 into floating gate 24. Coupling gate CG (also known as control gate) 26 is over floating gate 24 and is insulated therefrom. Erase gate EG 28 is over the first region 14 and is adjacent to floating gate 24 and coupling gate 26 and is insulated therefrom. The top corner of floating gate 24 may point toward the inside corner of the T-shaped erase gate 28 to enhance erase efficiency. Erase gate 28 is also insulated from the first region 14. Memory cell 10 is more particularly described in U.S. Pat. No. 7,868,375, whose disclosure is incorporated herein by reference in its entirety.

One exemplary operation for erase and program of prior art non-volatile memory cell 10 is as follows. Memory cell 10 is erased, through a Fowler-Nordheim tunneling mechanism, by applying a high voltage on erase gate 28 with other terminals equal to zero volts. Electrons tunnel from floating gate 24 into erase gate 28 causing floating gate 24 to be positively charged, turning on the cell 10 in a read condition. The resulting cell erased state is known as '1' state.

Memory cell 10 is programmed, through a source side hot electron programming mechanism, by applying a high voltage on coupling gate 26, a high voltage on source line 14, a medium voltage on erase gate 28, and a programming current on bit line 20. A portion of electrons flowing across the gap between word line 22 and floating gate 24 acquire enough energy to inject into floating gate 24 causing the floating gate 24 to be negatively charged, turning off the cell 10 in a read condition. The resulting cell programmed state is known as '0' state.

Memory cell 10 is read in a Current Sensing Mode as following: A bias voltage is applied on bit line 20, a bias voltage is applied on word line 22, a bias voltage is applied on coupling gate 26, a bias or zero voltage is applied on erase gate 28, and a ground is applied on source line 14. There exists a cell current flowing from bit line 20 to source line 14 for an erased state and there is insignificant or zero cell current flow from the bit line 20 to the source line 14 for a programmed state. Alternatively, memory cell 10 can be read in a Reverse Current Sensing Mode, in which bit line 20 is grounded and a bias voltage is applied on source line 24. In this mode the current reverses the direction from source line 14 to bitline 20.

Memory cell 10 alternatively can be read in a Voltage Sensing Mode as following: A bias current (to ground) is applied on bit line 20, a bias voltage is applied on word line 22, a bias voltage is applied on coupling gate 26, a bias voltage is applied on erase gate 28, and a bias voltage is applied on source line 14. There exists a cell output voltage (significantly >0V) on bit line 20 for an erased state and there is insignificant or close to zero output voltage on bit line 20 for a programmed state. Alternatively, memory cell 10 can be read in a Reverse Voltage Sensing Mode, in which bit line 20 is biased at a bias voltage and a bias current (to ground) is applied on source line 14. In this mode, memory cell 10 output voltage is on the source line 14 instead of on the bit line 20.

In the prior art, various combinations of positive or zero voltages were applied to word line 22, coupling gate 26, and floating gate 24 to perform read, program, and erase operations In response to the read, erase or program command, the logic circuit 270 (in FIG. 2) causes the various voltages to be supplied in a timely and least disturb manner to the various portions of both the selected memory cell 10 and the unselected memory cells 10.

For the selected and unselected memory cell 10, the voltage and current applied are as follows. As used hereinafter, the following abbreviations are used: source line or first region 14 (SL), bit line 20 (BL), word line 22 (WL), and coupling gate 26 (CG).

TABLE NO. 1

Operation of Flash Memory Cell 10 Using Positive Voltages for Read, Erase, and Program

|  | WL | WL-unsel | BL | BL-unsel | CG | CG-unsel same sector | CG-unsel | EG | EG-unsel |
|---|---|---|---|---|---|---|---|---|---|
| Read | 1.0-2 V | 0 V | 0.6-2 V | 0 V-FLT | 0-2.6 V | 0-2.6 V | 0-2.6 V | 0-2.6 V | 0-2.6 V |
| Erase | 0 V | 0 V | 0 V | 0 V | 0 V | 0-2.6 V | 0-2.6 V | 11.5-12 V | 0-2.6 V |
| Program | 1 V | 0 V | 1 uA | Vinh | 10-11 V | 0-2.6 V | 0-2.6 V | 4.5-5 V | 0-2.6 V |

TABLE NO. 1-continued

Operation of Flash Memory Cell 10 Using Positive Voltages for Read, Erase, and Program

|  | SL | SL-unsel |
|---|---|---|
| Read | 0 V | 0 V-FLT |
| Erase | 0 V | 0 V |
| Program | 4.5-5 V | 0-1 V/FLT |

In a recent application by the applicant—U.S. patent application Ser. No. 14/602,262, filed on Jan. 21, 2015, which is incorporated by reference—the applicant disclosed an invention whereby negative voltages could be applied to word line 22 and/or coupling gate 26 during read, program, and/or erase operations. In this embodiment, the voltage and current applied to the selected and unselected memory cell 10, are as follows.

flash memory cell 210 comprises substrate 12, first region (source line) 14, second region 16, channel region 18, bit line 20, word line 22, floating gate 24, and erase gate 28. Unlike prior art flash memory cell 10, flash memory cell 210 does not contain a coupling gate or control gate and only contains four terminals—bit line 20, word line 22, erase gate 28, and source line 14. This significantly reduces the com-

TABLE NO. 2

Operation of Flash Memory Cell 10 Using Negative Voltages for Read and/or Program

|  | WL | WL-unsel | BL | BL-unsel | CG | CG-unsel same sector | CG-unsel | EG | EG-unsel |
|---|---|---|---|---|---|---|---|---|---|
| Read | 1.0-2 V | −0.5 V/0 V | 0.6-2 V | 0 V-FLT | 0-2.6 V | 0-2.6 V | 0-2.6 V | 0-2.6 V | 0-2.6 V |
| Erase | 0 V | 0 V | 0 V | 0 V | 0 V | 0-2.6 V | 0-2.6 V | 11.5-12 V | 0-2.6 V |
| Program | 1 V | −0.5 V/0 V | 1 uA | Vinh | 10-11 V | 0-2.6 V | 0-2.6 V | 4.5-5 V | 0-2.6 V |

|  | SL | SL-unsel |
|---|---|---|
| Read | 0 V | 0 V-FLT |
| Erase | 0 V | 0 V |
| Program | 4.5-5 V | 0-1 V/FLT |

In another embodiment of U.S. patent application Ser. No. 14/602,262, negative voltages can be applied to word line 22 when memory cell 10 is unselected during read, erase, and program operations, and negative voltages can be applied to coupling gate 26 during an erase operation, such that the following voltages are applied:

plexity of the circuitry, such as decoder circuitry, required to operate an array of flash memory cells.

The erase operation (erasing through erase gate) and read operation are similar to that of the FIG. 1 except there is no control gate bias. The programming operation also is done without the control gate bias, hence the program voltage on

TABLE NO. 3

Operation of Flash Memory Cell 10 Using Negative Voltages for Erase

|  | WL | WL-unsel | BL | BL-unsel | CG | CG-unsel same sector | CG-unsel | EG | EG-unsel |
|---|---|---|---|---|---|---|---|---|---|
| Read | 1.0-2 V | −0.5 V/0 V | 0.6-2 V | 0-FLT | 0-2.6 V | 0-2.6 V | 0-2.6 V | 0-2.6 V | 0-2.6 V |
| Erase | 0 V | −0.5 V/0 V | 0 V | 0-FLT | −(5-9) V | 0-2.6 V | 0-2.6 V | 8-9 V | 0-2.6 V |
| Program | 1 V | −0.5 V/0 V | 1 uA | Vinh | 8-9 V | CGINTH (4-6 V) | 0-2.6 V | 8-9 V | 0-2.6 V |

|  | SL | SL-unsel |
|---|---|---|
| Read | 0 V | 0-FLT |
| Erase | 0 V | 0 V |
| Program | 4.5-5 V | 0-1 V/FLT |

The CGINH signal listed above is an inhibit signal that is applied to the coupling gate 26 of an unselected cell that shares an erase gate 28 with a selected cell.

FIG. 2 depicts an embodiment of another prior art flash memory cell 210. As with prior art flash memory cell 10, the source line is higher to compensate for lack of control gate bias.

Table No. 4 depicts typical voltage ranges that can be applied to the four terminals for performing read, erase, and program operations:

TABLE NO. 4

Operation of Flash Memory Cell 210

| | WL | WL-unsel | BL | BL-unsel | EG | EG-unsel | SL | SL-unsel |
|---|---|---|---|---|---|---|---|---|
| Read | 0.7-2.2 V | −0.5 V/0 V | 0.6-2 V | 0 V/FLT | 0-2.6 V | 0-2.6 V | 0 V | 0 V/FLT/VB |
| Erase | −0.5 V/0 V | −.5 V/0 V | 0 V | 0 V | 11.5 V | 0-2.6 V | 0 V | 0 V |
| Program | 1-1.5 V | −.5 V/0 V | 1-3 μA | Vinh (~1.8 V) | 4.5 V | 0-2.6 V | 7-9 V | 0-1 V/FLT |

FIG. 3 depicts an embodiment of another prior art flash memory cell 310. As with prior art flash memory cell 10, flash memory cell 310 comprises substrate 12, first region (source line) 14, second region 16, channel region 18, bit line 20, and floating gate 24, and erase gate 28. Unlike prior art flash memory cell 10, flash memory cell 310 does not contain a coupling gate or control gate or an erase gate. In addition, word line 322 replaces word line 22 and has a different physical shape than word line 22, as depicted.

One exemplary operation for erase and program of prior art non-volatile memory cell 310 is as follows. The cell 310 is erased, through a Fowler-Nordheim tunneling mechanism, by applying a high voltage on the word line 322 and zero volts to the bit line and source line. Electrons tunnel from the floating gate 24 into the word line 322 causing the floating gate 24 to be positively charged, turning on the cell 310 in a read condition. The resulting cell erased state is known as '1' state. The cell 310 is programmed, through a source side hot electron programming mechanism, by applying a high voltage on the source line 14, a small voltage on the word line 322, and a programming current on the bit line 320. A portion of electrons flowing across the gap between the word line 322 and the floating gate 24 acquire enough energy to inject into the floating gate 24 causing the floating gate 24 to be negatively charged, turning off the cell 310 in read condition. The resulting cell programmed state is known as '0' state.

Exemplary voltages that can be used for the read, program, erase, and standby operations in memory cell 310 are shown below in Table 5:

TABLE NO. 5

Operation of Flash Memory Cell 310

| Operation | WL | BL | SL |
|---|---|---|---|
| Read | Vwlrd | Vblrd | 0 V |
| Program | Vwlp | Iprog/Vinh (unsel) | Vslp |
| Erase | Vwler | 0 V | 0 V |
| Standby | 0 V | 0 V | 0 V |

Vwlrd ~2-3 V
Vblrd ~0.8-2 V
Vwlp ~1-2 V
Vwler ~11-13 V
Vslp ~9-10 V
Iprog ~1-3ua
Vinh ~2 V Also known in the prior art are various techniques for performing address fault detection in a memory system. Address faults sometimes occur due to imperfections in materials or due to radiation, such as solar flares, which can cause a "1" bit to flip to a "0" bit and vice-versa within an address. The result of an address fault is that a decoder might receive an intended address for an operation, but due to a fault occurring, a bit in the decoder will be altered, and the decoder might activate the word line corresponding to a different address, which will cause the wrong row in a memory array to be accessed. Another possible result is that the fault will result in the decoder activating the word line corresponding to the intended address and a word line corresponding to another address different than the intended address. If not detected or corrected, an address fault will cause an erroneous read or write/program operation to occur.

FIG. 4 depicts prior art memory system 400. Prior art memory system 400 comprises row decoder 410 and array 420. Row decoder 410 receives address X, which here is an address or portion of an address corresponding to a selected row in array 420. Row decoder 410 decodes address X and selects a word line corresponding to that selected row. In this simplified example, four words lines are shown—WL0 (corresponding to address 0000), WL1 (corresponding to address 0001), WL2 (corresponding to address 0010), and WL3 (corresponding to address 0011). The selected word line will activate a row of memory cells within array 420. Thus for example, if address 0010 is received, row decoder 410 will activate WL2 (corresponding to address 0010).

FIG. 5 depicts prior art memory system 400 as in FIG. 4. However, in this situation, an address fault has occurred. Row decoder 410 receives address 0010, but this time, instead of activating WL2 (corresponding to address 0010), row decoder 410 instead activates WL3 (corresponding to address 0011) due to a fault that occurred in row decoder 410. If this fault is undetected or uncorrected, an erroneous read or program operation occurs.

FIG. 6 depicts prior art memory system 400 as in FIGS. 4 and 5. However, in this situation, a different type of address fault has occurred than in FIG. 4. Row decoder 410 receives address 0010, but this time, instead of only activating WL2 (corresponding to address 0010), row decoder 410 instead activates WL2 and WL3 (corresponding to address 0011) due to a fault that occurred in row decoder 410. If this fault is undetected or uncorrected, an erroneous read or program operation will occur.

FIG. 7 depicts prior art memory system 700. Memory system 700 comprises row decoder 410 and array 420 as in the memory systems of previous figures. However, the word lines, such as WL0, WL1, WL2, and WL3, also are coupled to ROM (read-only memory) 710. ROM 710 performs a validation function. Each word line is coupled to a row of cells in ROM 710. When a particular word line is activated, the corresponding row of cells in ROM 710 is activated. By design, each word line corresponds to one row in ROM 710, and each row in ROM 710 stores a different value in its cells. In this example, each row in ROM 710 stores a value that is identical to the address corresponding to the word line tied to that row. Thus, WL0 corresponds to address 0000, and the value stored in the row in ROM 710 attached to WL0 also is 0000.

In FIG. 8, memory system 700 is again depicted. Row decoder 410 receives address 0010, but due to a fault condition, WL3 (corresponding to address 0011) is selected instead of WL2 (corresponding to address 0010). This will cause the wrong row of memory cells to be selected in array 420. Because WL3 is activated, the row in ROM 710 corresponding to WL3 also is activated, and ROM 710 outputs value 0011 stored in that row. Comparator 450 compares the address received by row decoder 410 (i.e., 0010) with the output of ROM 710 (i.e., 0011) and determines the values do not match. Comparator 450 can then output a value (such as "0") that is understood to mean that a match was not found, which will indicate that an address fault has occurred.

Although prior art memory system 700 is able to detect address faults where the wrong word line is activated, prior art memory system 700 is unable to detect a fault in at least some situations where multiple rows are selected instead of just one row. In FIG. 9, memory system 700 again is depicted. In this example, an address fault occurs where the word line for the intended row (i.e., WL2 for address 0010) is activated and another word line (i.e., WL3 for address 0011) is activated. WL2 and WL3 will both be activated, and the contents for both rows in ROM 710 will be output. Logically, ROM 710 is designed such that when two rows are activated, the output will be an "OR" of the two rows. Thus, the stored values of 0010 and 0011 will cause the output to be 0011. Comparator 450 will compare the address received by row decoder 410 (i.e., 0010) and the output of ROM 710 (i.e., 0011). In this instance, a fault will be detected. However, if instead the intended address was 0011, and the fault was such that the word lines corresponding to 0010 and 0011 were again activated, then the output of ROM 710 would be 0011 (which is the same as the address received by row decoder 410), and the comparator would not detect a fault. Thus, it can be appreciated that memory system 700 is not always effective at identifying address faults of this type where two rows are selected instead of one row.

What is needed is an improved address fault detection system that can identify two types of address faults in a memory system, namely, a first situation where the wrong word line is asserted and a second situation where the right word line is asserted but a second line also is asserted.

SUMMARY OF THE INVENTION

A system and method are disclosed for performing address fault detection in a flash memory system. An address fault detection array is used to confirm that an activated word line or bit line is the word line or bit line that was actually intended to be activated based upon the received address, which will identify a type of fault where the wrong word line or bit line is activated. The address fault detection array also is used to indicate whether more than one word line or bit line was activated, which will identify a type of fault where two or more word lines or bit lines are activated.

BRIEF DESCRIPTION OF THE DRAWINGS

FIG. 17 depicts a prior art encoding scheme for validation data for addresses.

FIG. 18A depicts an embodiment of an encoding scheme for validation data for addresses.

FIG. 18B depicts another embodiment of an encoding scheme for validation data for addresses.

FIG. 19 depicts another embodiment of an encoding scheme for validation data for addresses.

FIG. 20 depicts another embodiment of an encoding scheme for validation data for addresses.

DETAILED DESCRIPTION OF THE PREFERRED EMBODIMENT

Figure 1:
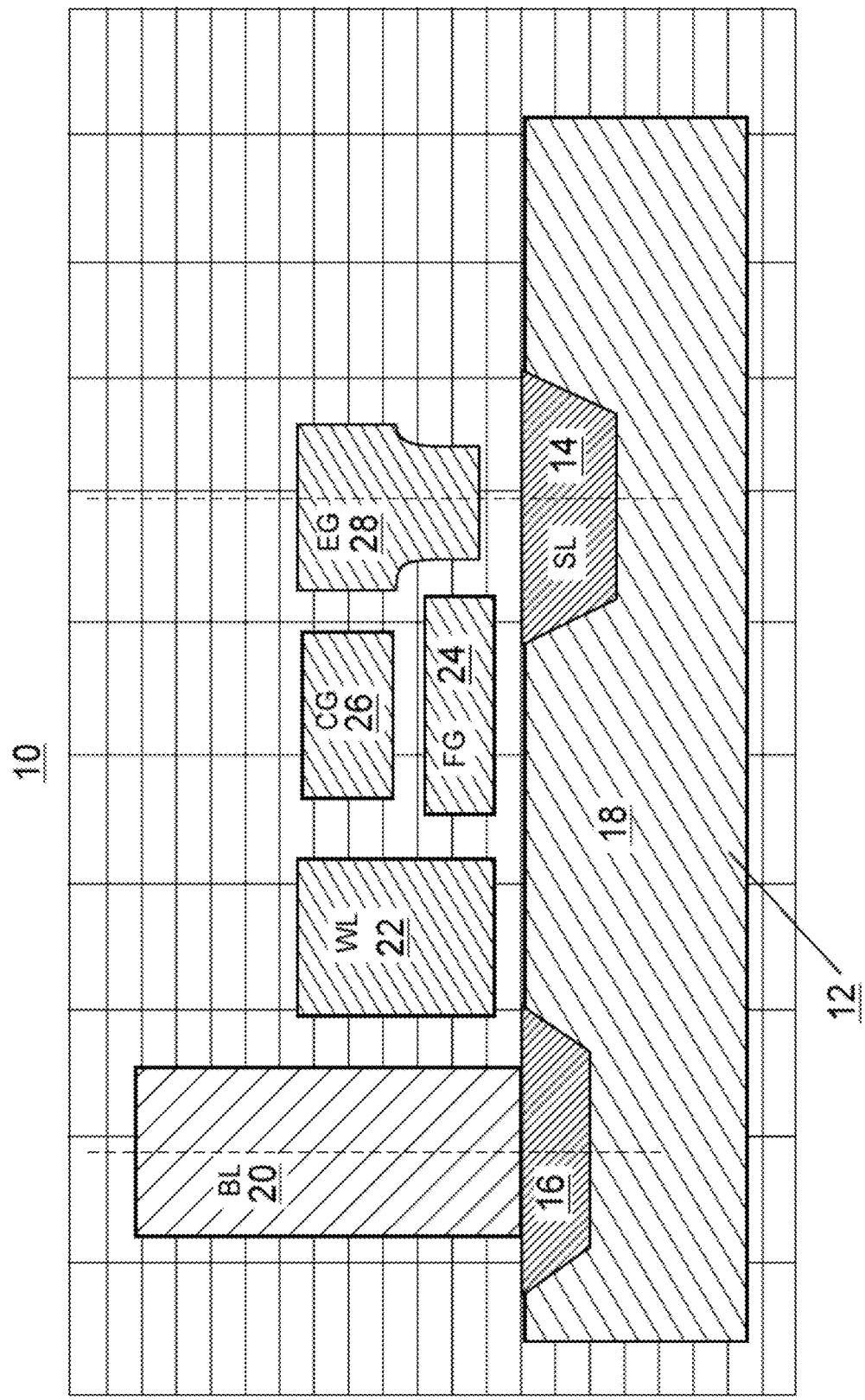
FIG. 1 is a cross-sectional view of a prior art non-volatile memory cell to which the invention can be applied.
Figure 2:
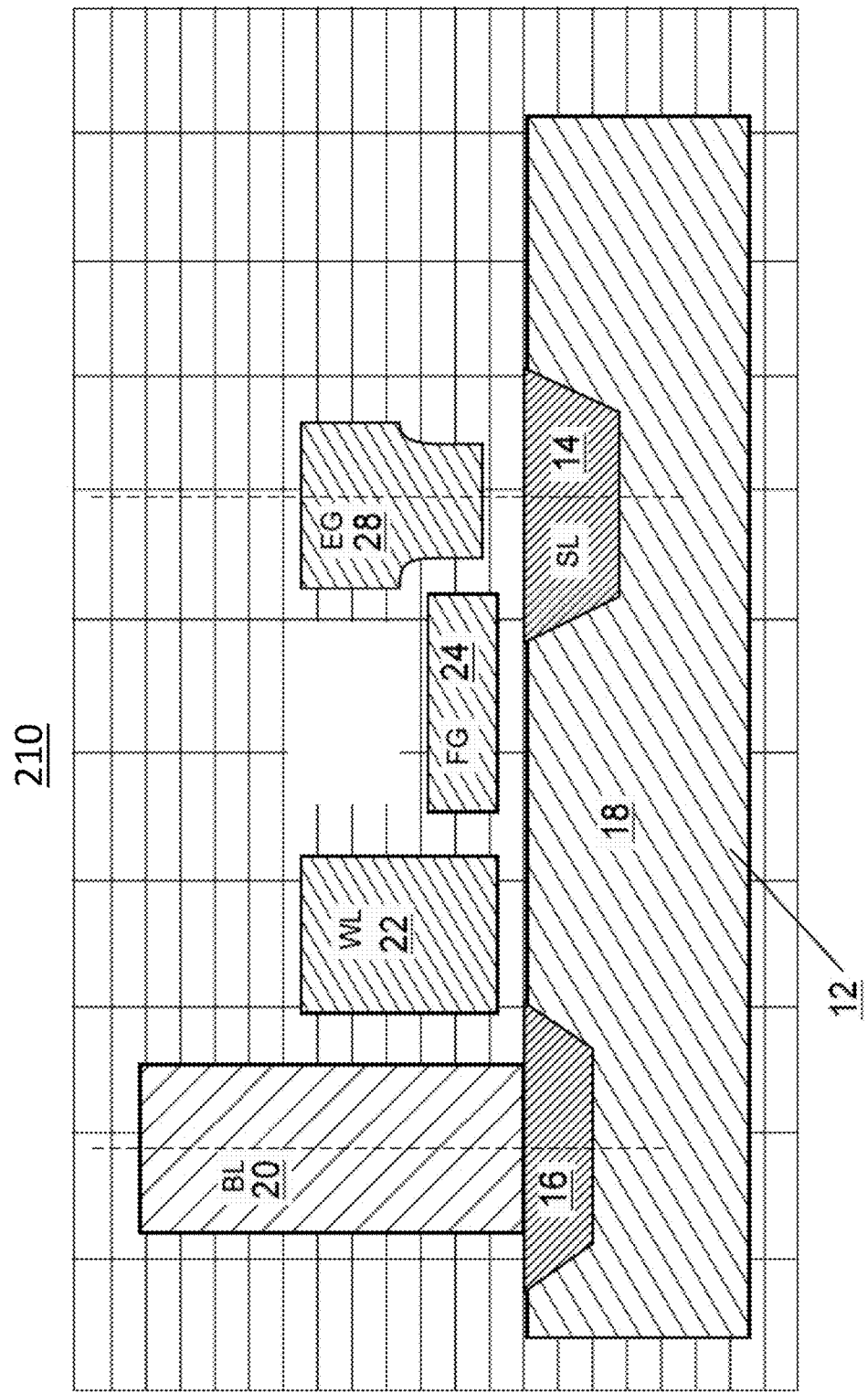
FIG. 2 is a cross-sectional view of another prior art non-volatile memory cell to which the invention can be applied.
Figure 3:
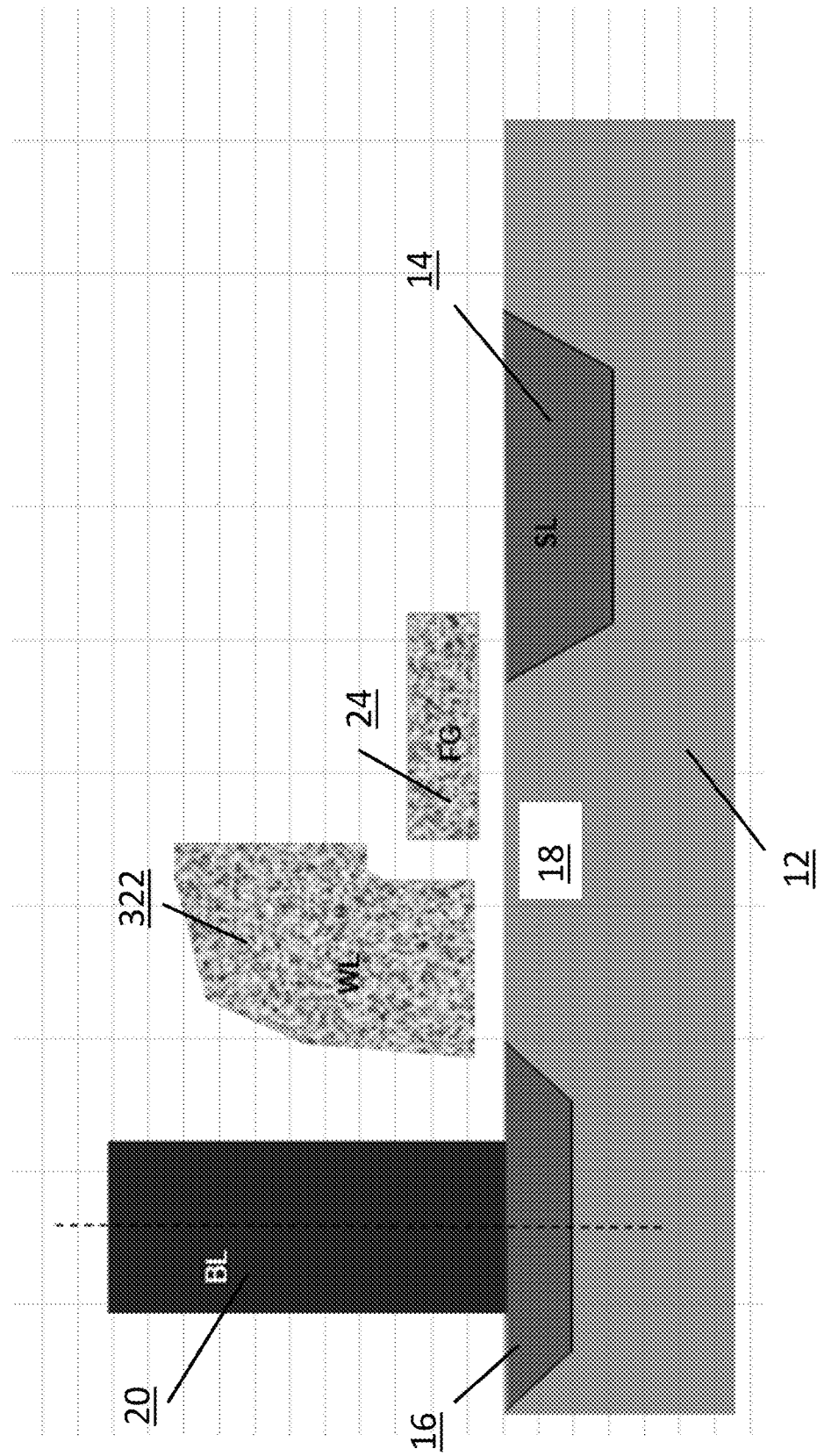
FIG. 3 is a cross-sectional view of another prior art non-volatile memory cell to which the invention can be applied.
Figure 4:
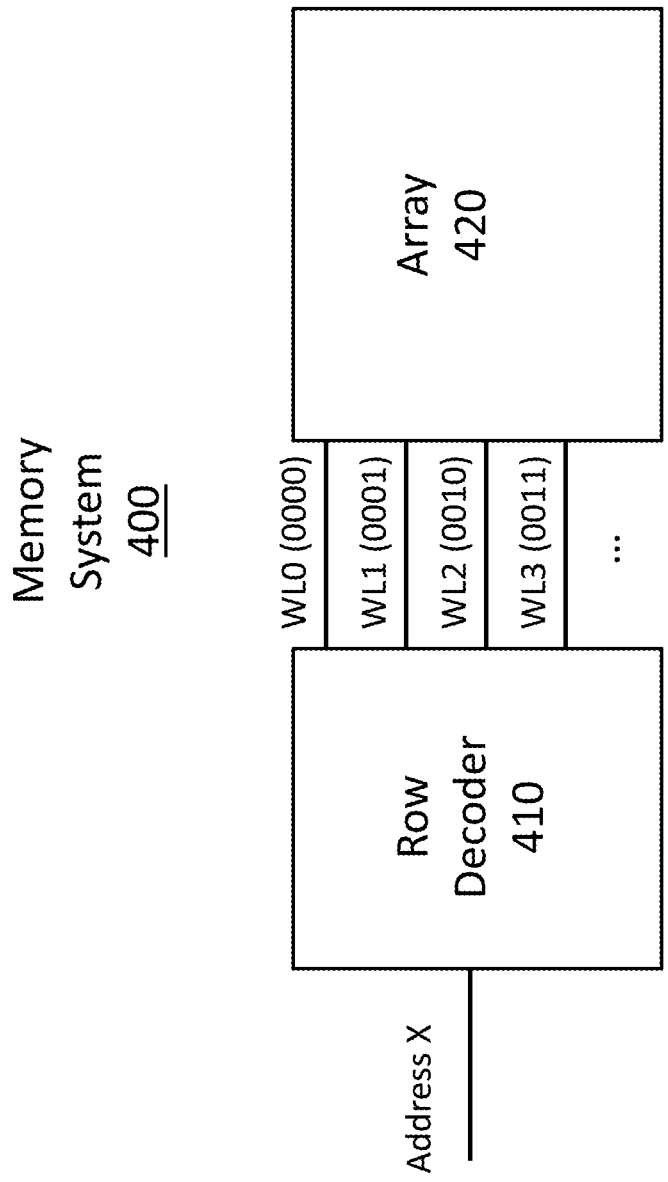
FIG. 4 depicts a prior art memory system.
Figure 5:
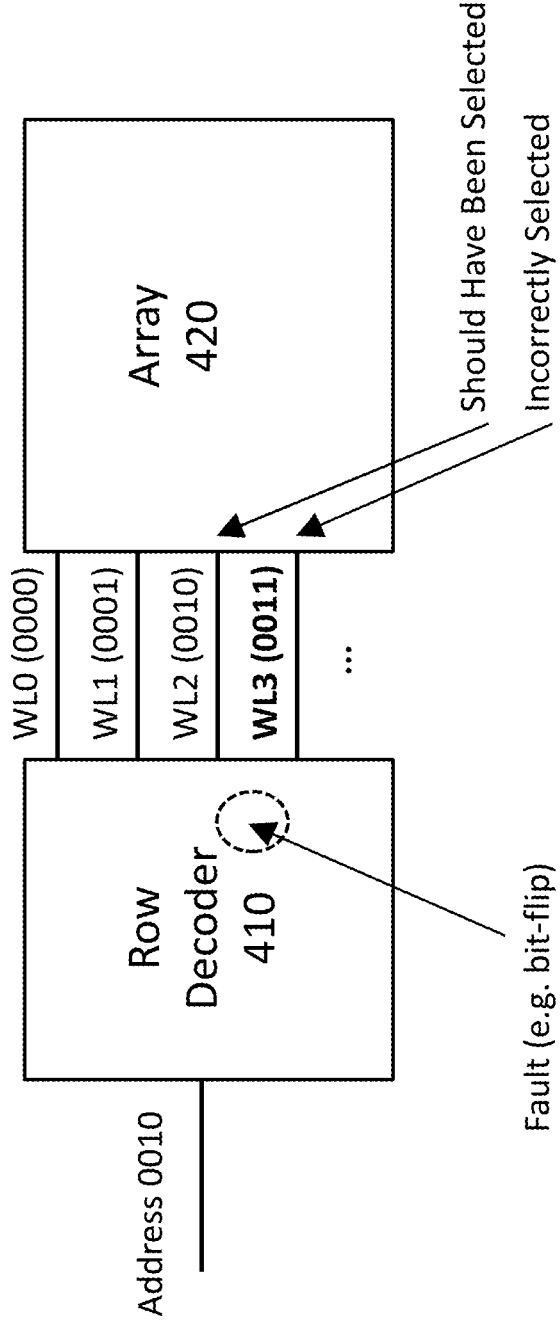
FIG. 5 depicts one type of address fault that can occur in the prior art memory system of FIG. 4.
Figure 6:
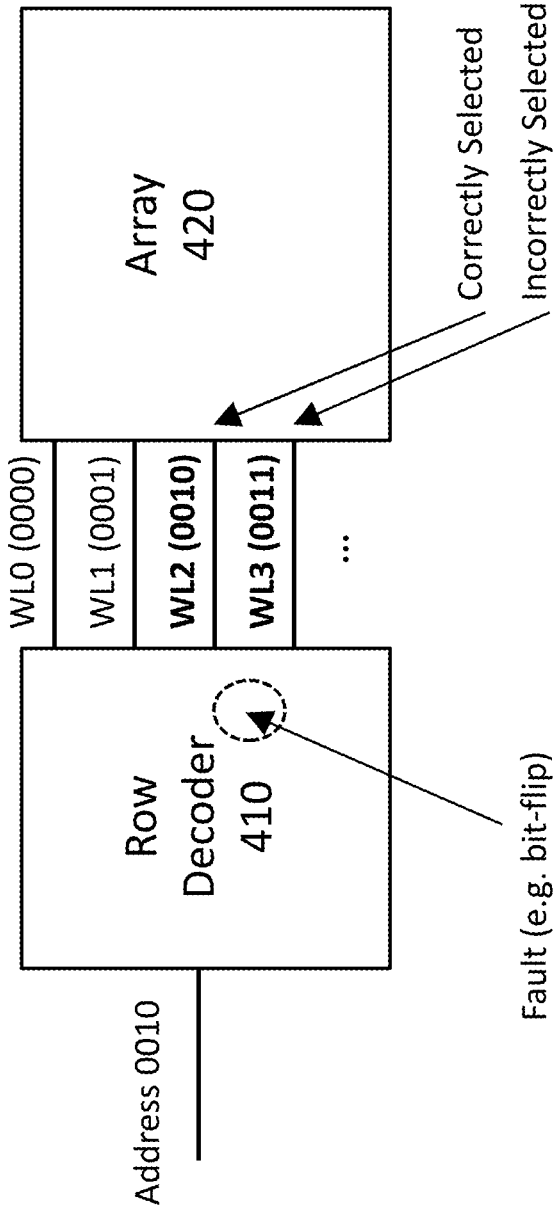
FIG. 6 depicts another type of address fault that can occur in the prior art memory system of FIG. 4.
Figure 7:
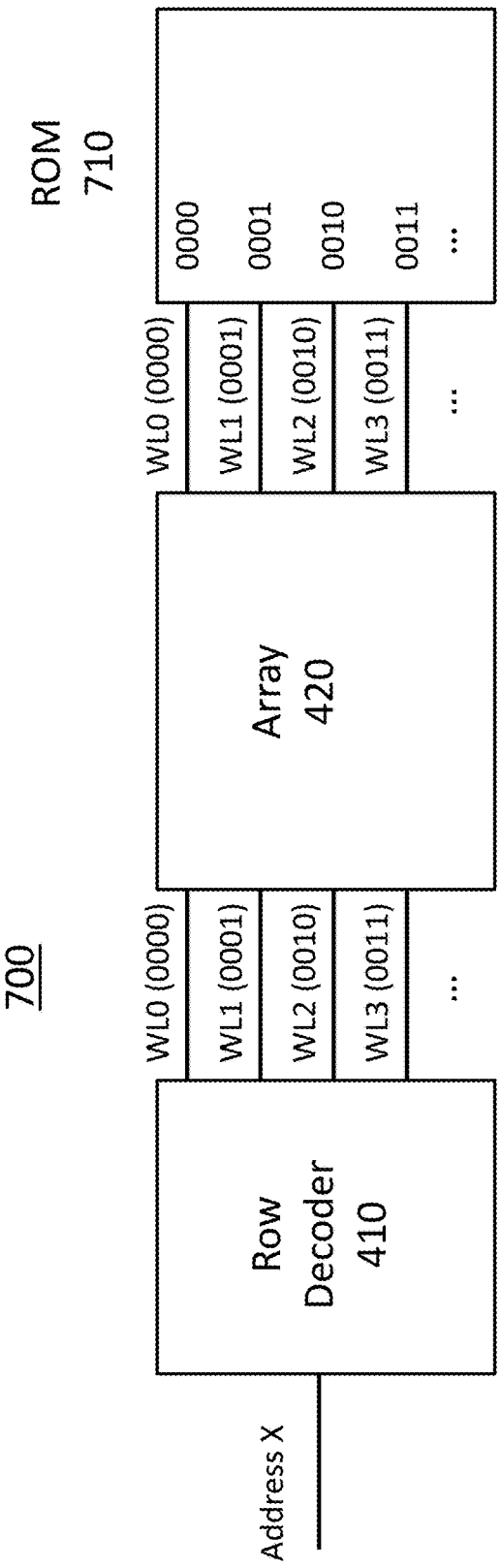
FIG. 7 depicts a prior art address fault detection system.
Figure 8:
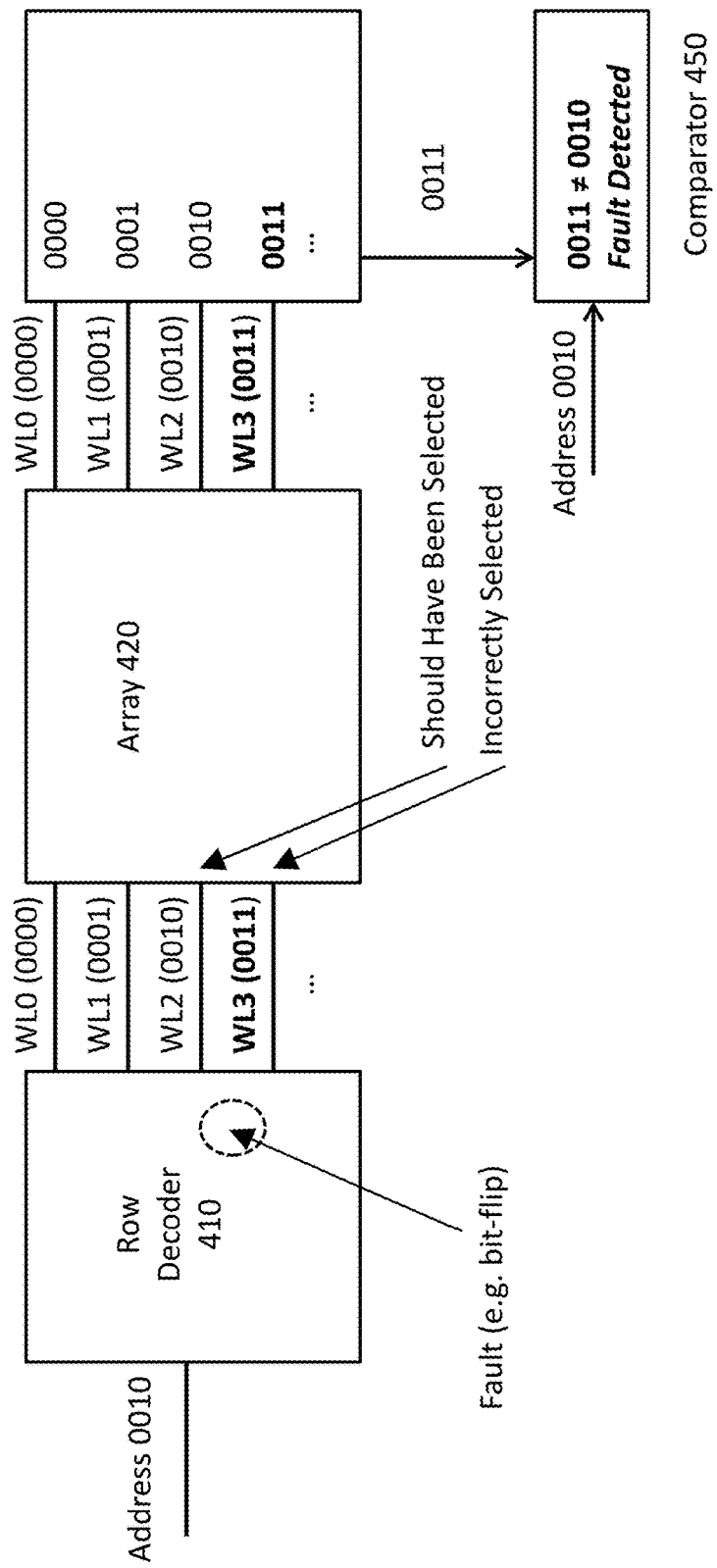
FIG. 8 depicts the prior art address fault detection system of FIG. 7 and one type of address fault.
Figure 9:
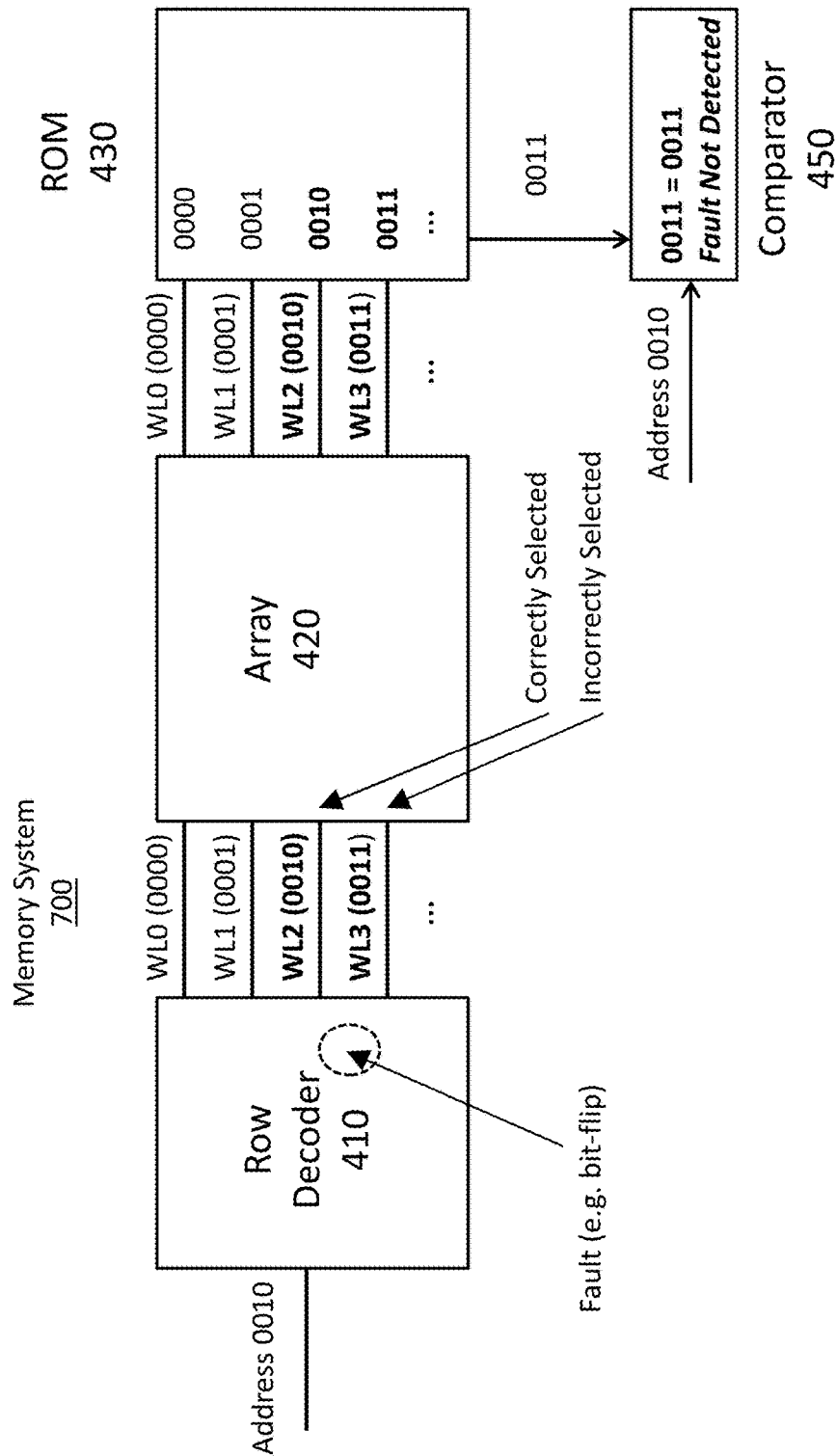
FIG. 9 depicts the prior art address fault detection system of FIG. 7 and another type of address fault.
Figure 10:
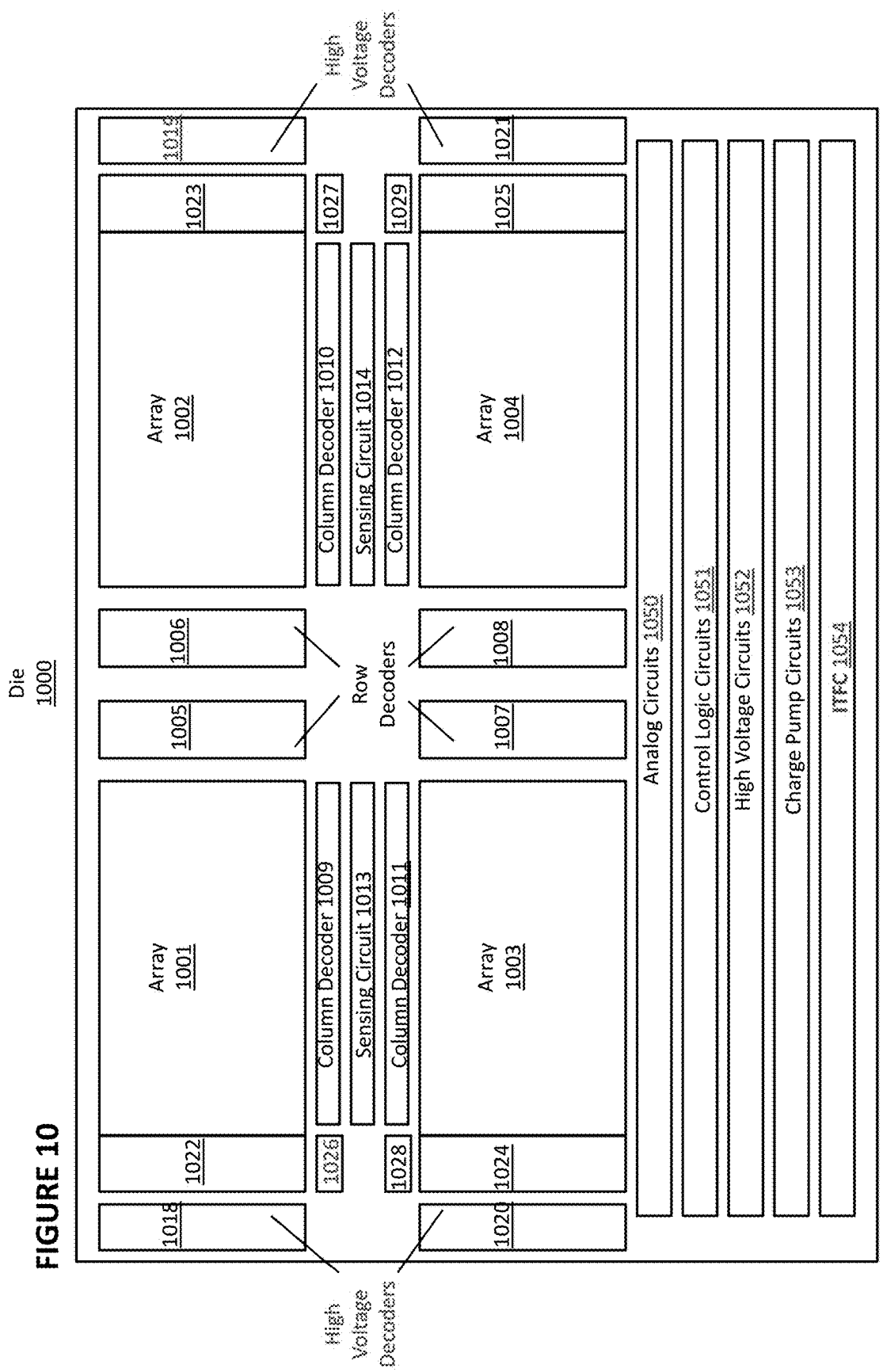
FIG. 10 is a layout diagram of a die comprising non-volatile memory cells of the type shown in FIGS. 1-3 and containing an improved address fault detection system.

FIG. 10 depicts an embodiment of a flash memory system comprising the address fault detection system of the present invention. Die 1000 comprises: memory arrays 1001, 1002, 1003, and 1004 for storing data, each memory array optionally utilizing memory cell 10 as in FIG. 1, memory cell 210 as in FIG. 2, memory cell 310 as in FIG. 3, or other known types of memory cells; row decoder circuits 1005, 1006, 1007, and 1008 used to access the row in memory arrays 1001, 1002, 1003, and 1004, respectively, to be read from or written to; column decoder circuits 1009, 1010, 1011, and 1012 used to access the column in memory arrays 1001, 1002, 1003, and 1004, respectively, to be read from or written to; sensing circuit 1013 used to read data from memory arrays 1001 and 1003 and sensing circuit 1014 used to read data from memory arrays 1002 and 1004; analog circuits 1050; control logic circuits 1051 for providing various control functions, such as redundancy and built-in self-testing; high voltage circuits 1052 used to provide positive and negative voltage supplies for the system; charge pump circuits 1053 to provide increased voltages for erase and program operations for memory arrays 1001, 1002, 1003, and 1004; and interface circuit (ITFC) 1054 to provide interface pins to connect to other macros on chip; high voltage decoder circuits 1018, 1019, 1020, and 1021 using during read, erase, and program operations as needed. Die 1000 further comprises address fault detection blocks 1022, 1023, 1024, and 1025 and array fault detection sense circuits 1026, 1027, 1028, and 1029, discussed in greater detail below.

Figure 11:
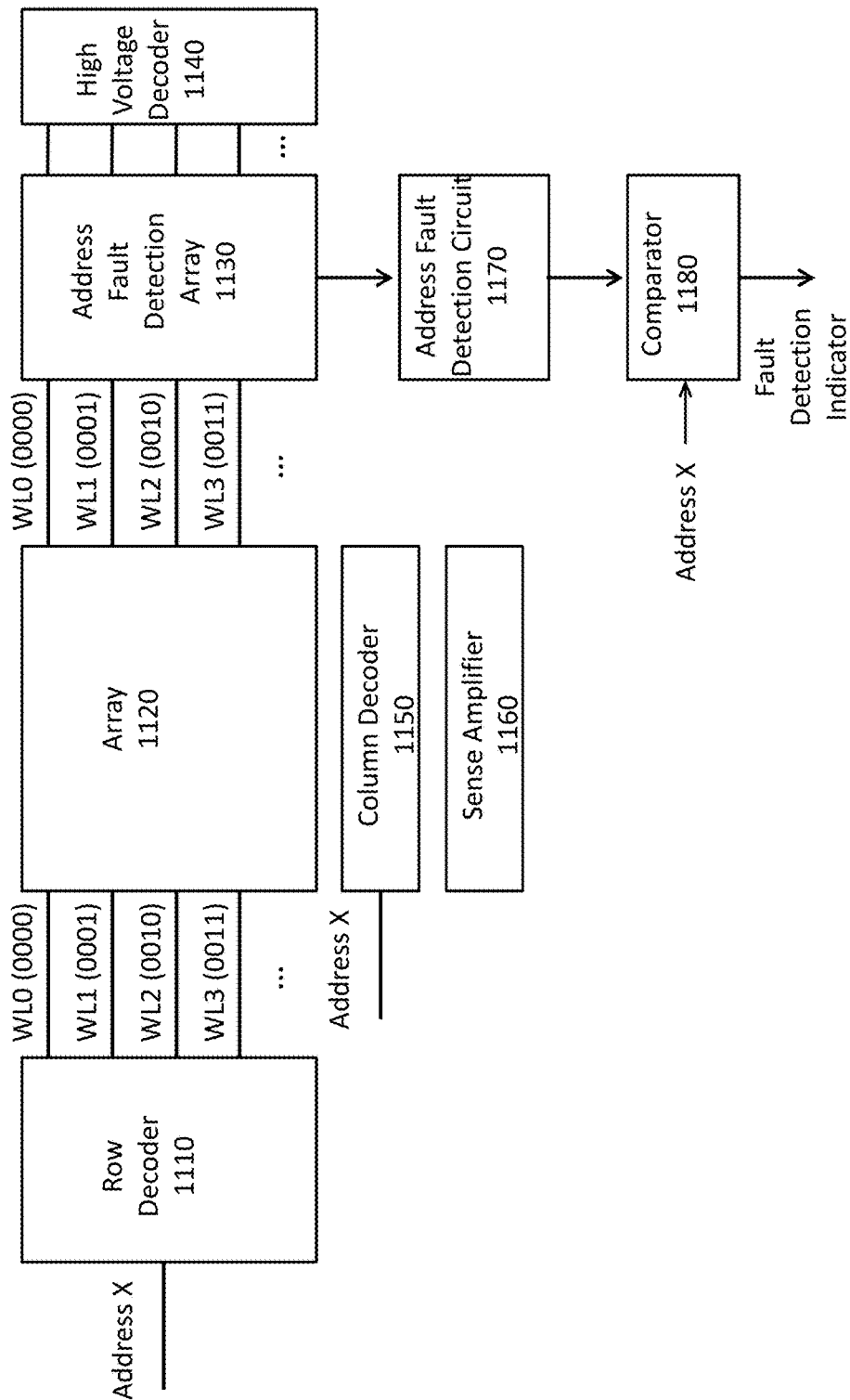
FIG. 11 depicts an embodiment of an address fault detection system.

FIG. 11 depicts an embodiment of an improved address fault detection system and method. Memory system 1100 comprises row decoder 1110, array 1120, high voltage decoder 1140, column decoder 1150, and sense amplifier 1160, each of which corresponds to components with similar descriptions in FIG. 10.

Memory system 1100 further comprises address fault detection array 1130, address fault detection circuit 1170, and comparator 1180. Address fault detection circuit 1130 comprises a ROM array, flash array, or other non-volatile memory device that stores an encoded value for each possible address that can be received by row decoder 1110 and/or column decoder 1150.

Various encoding schemes are contemplated for generating validation data for each possible address. A prior art encoding scheme is shown in FIG. 17. Address fault detection array 1130 contains an encoded value for each possible address. In this example, a four-bit address is shown, which is the address that can be received by row decoder 1110 and/or column decoder 1150. For simplicity's sake, it is assumed that the row portion of the address is four bits, ranging from 0000 to 1111. Each of these possible addresses is associated with a word line, which here will range from WL0 to WL15 (16 different row addresses and word lines). Each word line will activate a row in address fault detection array 1130, and each row stores a value equal to the row address associated with that word line. Thus, address 0000 is associated with WL0, which in turn will activate a row storing the value 0000 in address fault detection array 1130.

With reference again to FIG. 11, under the encoding scheme of FIG. 17, Address X is received by row decoder 1110, which in turn will activate a word line that will access a row in array 1120 and a row in address fault detection array 1130. Address fault detection circuit 1170 will sense a value for each column in address fault detection array 1130. The value in each column will be a logical "OR" of the value in each activated row in address fault detection array 1130. The value from each column will be input to comparator 1180, which will compare the received values against Address X (or, in this example, the row address portion of Address X). As discussed previously, the output of comparator 1180 will identify a fault in situations where the wrong row has been activated, because in that situation the comparator will output a value indicating that the two input values are different. However, this scheme alone will not be effective in every situation involving a fault where two rows have been activated due to a fault.

An improved encoding scheme is shown in FIG. 18A. One of ordinary skill in the art will appreciate that storing and detecting a "1" value in address fault detection array 1130 consumes more energy than is the case for a "0" value. In this encoding scheme, an additional bit is stored, here labeled as "PB" (polarity bit). If PB is "0," then the encoded bits are a direct match to the associated address. If PB is "1," then the encoded bits are an inverted version of the associated address. In this embodiment, a "1" value will be used for PB whenever more than half of the bits in the address are a "1." For example, for an address "1111," a value of "0000" is stored in address fault detection array 1130, and a "1" is stored in the PB bit for that value to indicate that each the value is an inverted version of the corresponding address. By following this scheme, the memory system will consume less energy than would be the case in using the prior art scheme of FIG. 17.

FIG. 18B shows an improved encoding scheme similar to that in FIG. 18A, with additional column for multiple row detection (MRD). The MRD column contains a '1' in each row. A detailed description of the multiple row detection is contained below, Another improved encoding scheme is shown in FIG. 19. Here, each "0" in the address is encoded as "01" in address fault detection array 1130, and each "1" in the address is encoded as "10" in address fault detection array 1130. Thus, the address "0000" is encoded as "01010101," and address "1111" is encoded as "10101010." Each bit Ax in the address is encoded as EAx and EBx. This means that the encoded values in address fault detection circuit 1130 will contain twice as many bits as the corresponding address. Because any two addresses will always differ from each other by at least one bit, the sum of any two encoded values corresponding to two addresses will contain a "11" pattern in at least one bit pair (EAx and EBx). Thus, detecting a "11" pattern in the sensed value of address fault detection array 1130 will indicate that two addresses have been activated, which is a fault condition. This is a type of fault condition that the prior art solution of FIG. 17 is unable to detect at least some of the time.

Figure 12:
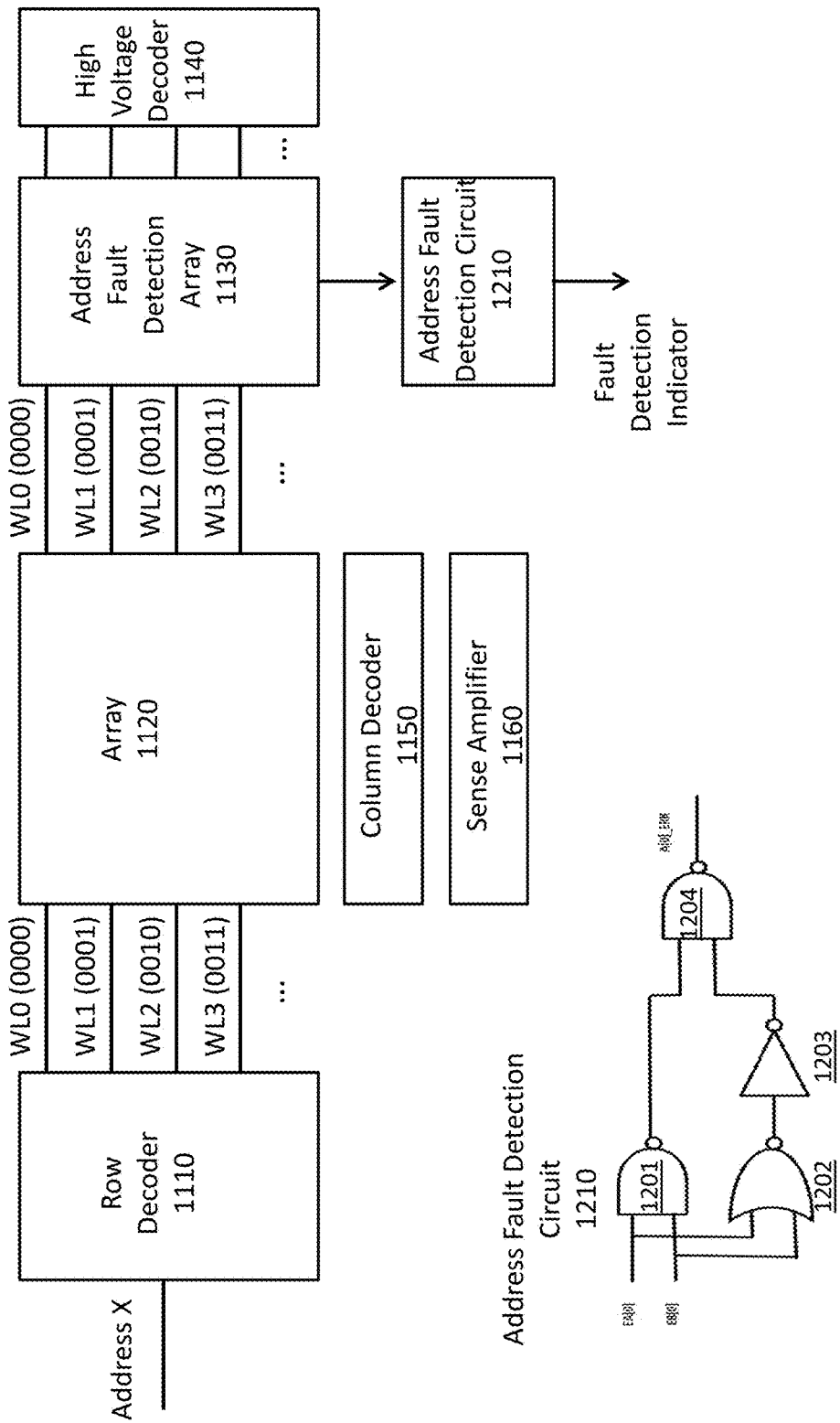
FIG. 12 depicts another embodiment of an address fault detection system.

FIG. 12 depicts an embodiment of an address fault detection system and method for implementing the encoding scheme of FIG. 19. Memory system 1200 comprises the same components as memory system 1100, except that address fault detection circuit 1210 follows a different design than address fault detection circuit 1170. Here, address fault detection circuit 1210 receives an output from each column in address fault detection array 1130, with the values in any given column being logically "OR'd" to create the output for that column.

FIG. 12 further depicts an embodiment of address fault detection circuit 1210. In response to the activation of a row containing bits EAx and EBx (where x=number of address bits encoded in each row of address fault detection circuit 1210), each pair of bits, EAx and EBx, are input into address fault detection circuit 1210. Address fault detection circuit 1210 comprises NAND gates 1201 and 1204, NOR gate 1202, and inverter 1203, configured as shown. The output of address fault detection circuit 1210 will be a "0" if the input is "01" or "10" and will be a "1" otherwise. A "1" indicates a fault condition (because a "11" or "00" pattern should not occur during normal operation), and would indicate that two rows had been activated instead of one row, which is the only situation that will cause a EAx and EBx to be "11," or that the received address has been altered, which is the only situation that will cause a EAx and EBx to be "00." Thus, address fault detection circuit 1210 is able to detect a fault situation where two rows have been improperly activated, which is a feature lacking in prior art systems.

Figure 13A:
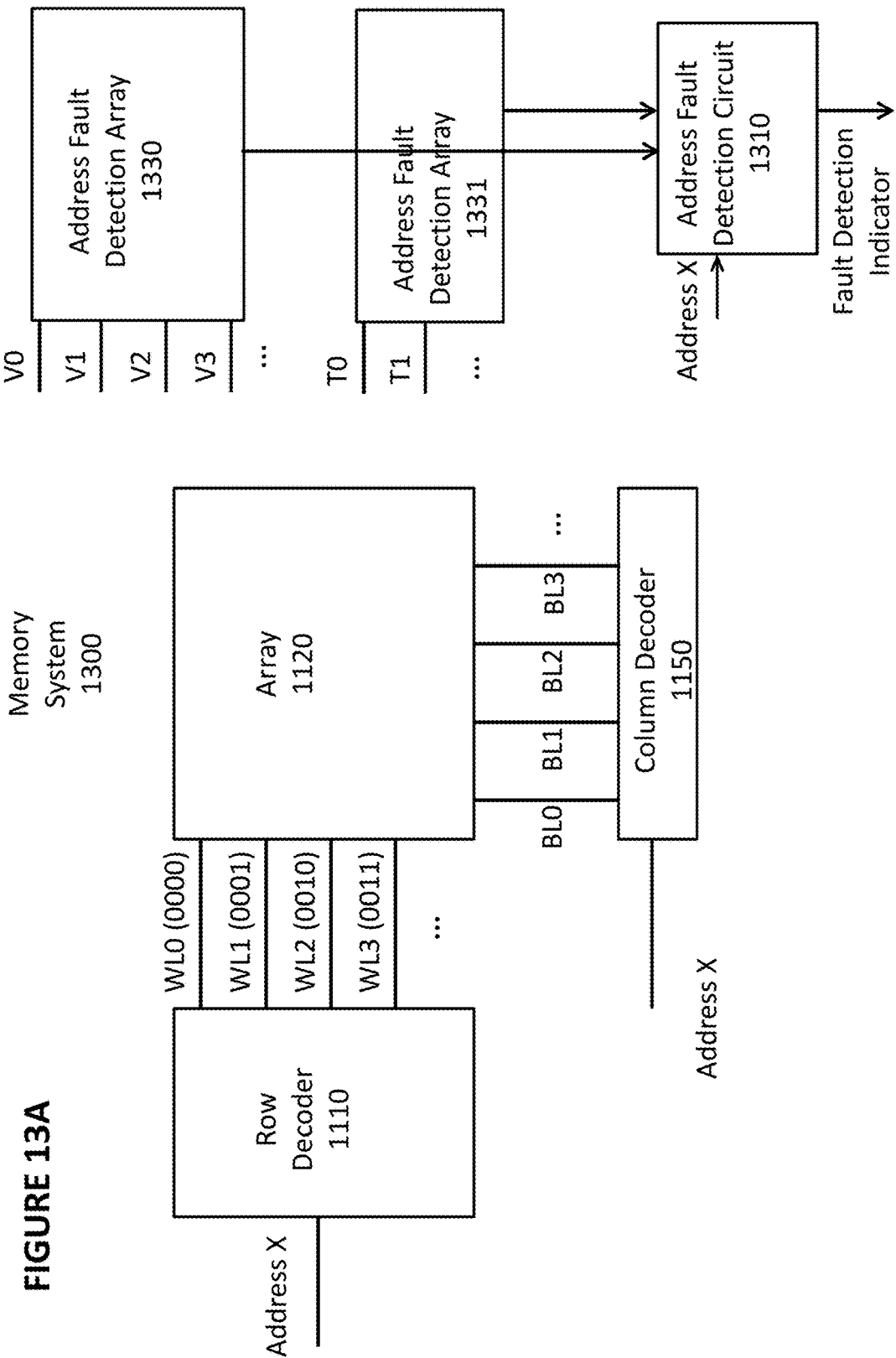
FIGS. 13A and 13B depict another embodiment of an address fault detection system.
Figure 13B:
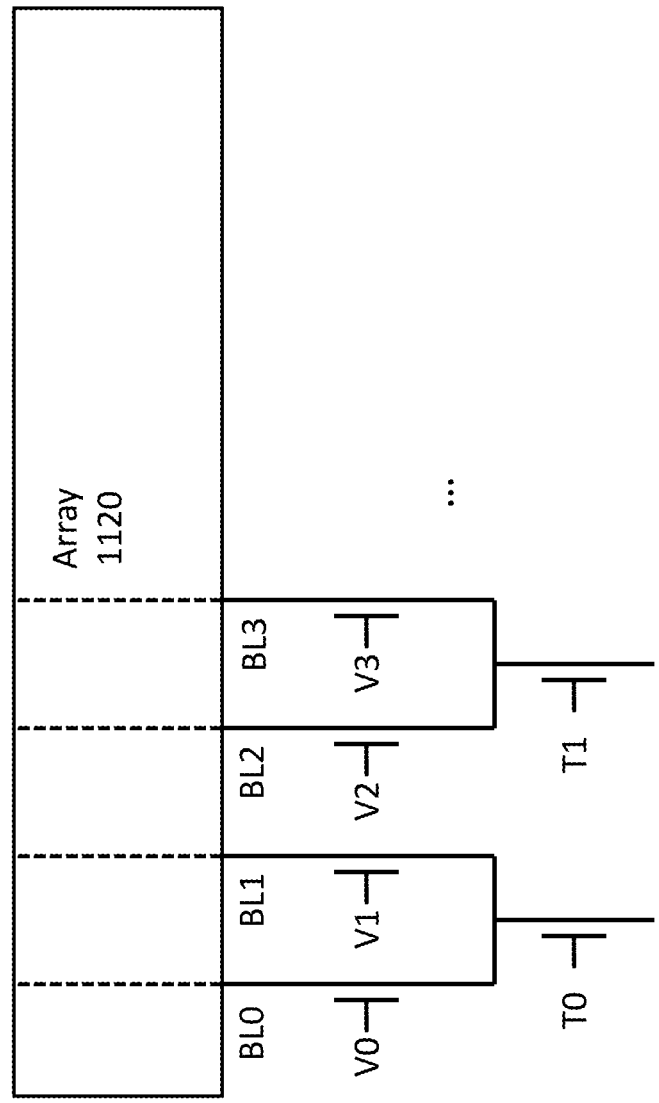

FIG. 13A depicts another embodiment of an improved address fault detection system. Memory system 1300 includes row decoder 1110, array 1120, and column decoder 1150 as in previously described embodiments. Memory system 1300 further includes address fault detection array 1330, address fault detection array 1331, and address fault detection circuit 1310. Column decoder 1150 is a set of multiplexors, and often will comprise tiered multiplexors. With reference to FIG. 13B, a portion of exemplary column decoder 1150 is shown. Each column in array 1120 is coupled to a bit line. Here, four bit lines are shown and labeled as BL0 to BL3. A first tier of multiplexors selects a pair of adjacent bit lines to be activated. Two such multiplexors are shown: T0 and T1. A second tier of multiplexors selects a bit line among a pair of adjacent bit lines. Here, each bit line has its own multiplexor, labeled as V0 through V3. Thus, if BL0 is intended to be selected, then W0 and V0 will be activated.

With reference again to FIG. 13A, it can be appreciated that column decoder 1150 is susceptible to faults as is row decoder 1110. In this example, Address X is input to column decoder 1150. Here Address X comprises a row address portion and a column address portion. Address X contains bits that indicate which multiplexors are to be activated (which in turn will assert a bit line). Each bit line is coupled to a row in address fault detection array 1310. When a bit line is asserted, a row in address fault detection array 1330 will be asserted and a row in address fault detection array 1331 will be asserted, and a value will be output. That value can be compared to the column portion of Address X. If the values are different, then a fault has occurred and the wrong bit line has been asserted.

An exemplary encoding scheme for use in the embodiment of FIG. 13A is shown in FIG. 20. Here, two tiers of multiplexors are used. The first tier comprises multiplexors controlled by values T[0] through T[3], and the second tier comprises multiplexors controlled by values V[0] through V[7]. It is to be understood that additional tiers are possible. Here, each multiplexor in the first tier is associated with a three-bit value (e.g., V[0]=000), and each multiplexor in the second tier is associated with a two-bit value (e.g., T[0]=00). Address fault detection array 1330 and 1331 contains an encoded value for each multiplexor value. As in FIG. 19, each "0" in the column component of the address is encoded as "01," and each "1" in the address is encoded as "10."

With reference again to FIG. 13A, the encoding scheme of FIG. 20 can be used. Address fault detection circuit 1310 follows the same design as address fault detection circuit 1210 and will output a "0" if a "11" or "00" pattern is detected in bit pairs of the encoded values stored in address fault detection array 1310. Thus, memory system 1300 is able to detect faults in the column components of addresses.

Figure 14:
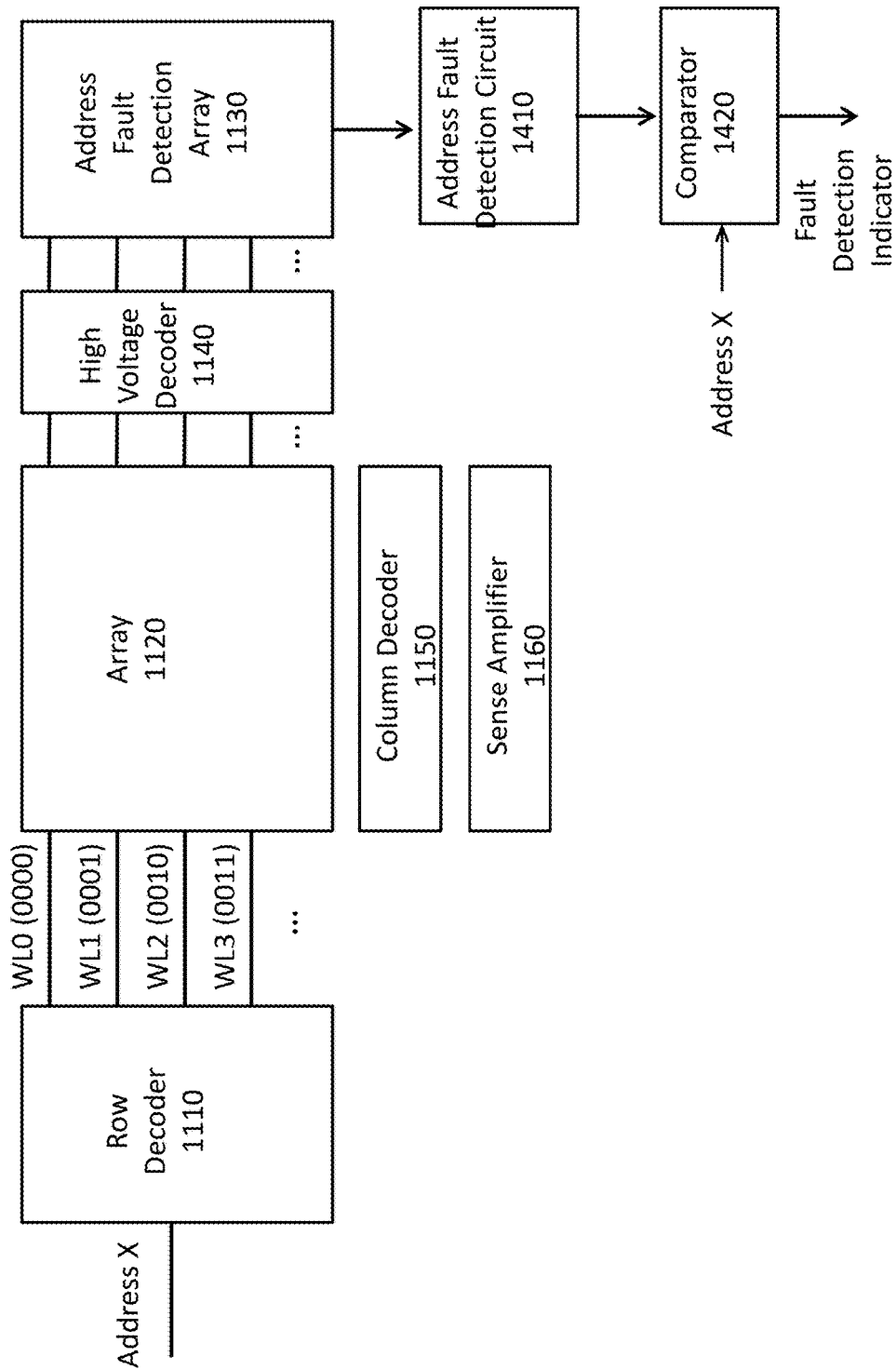
FIG. 14 depicts another embodiment of an address fault detection system.
Figure 15:
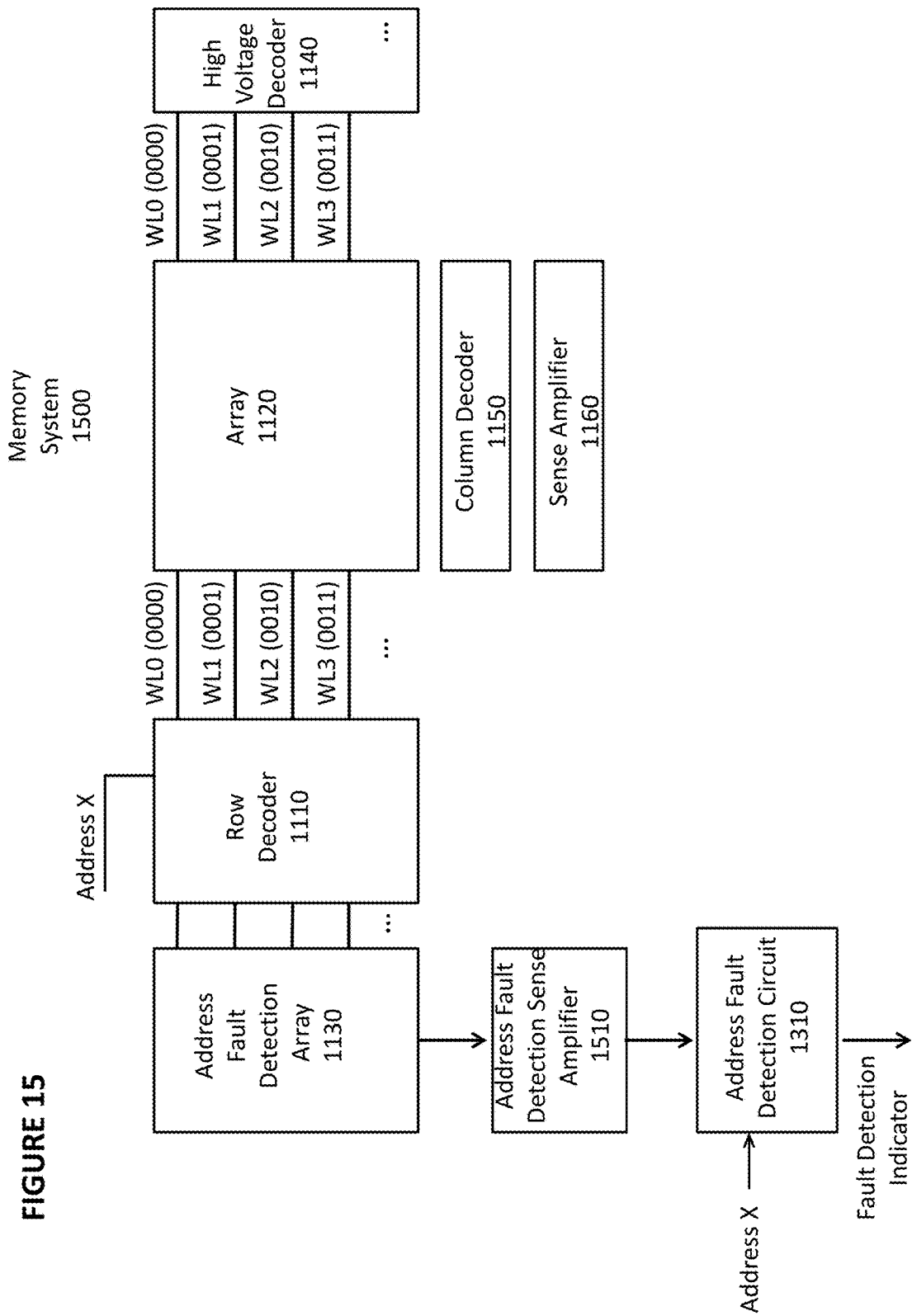
FIG. 15 depicts another embodiment of an address fault detection system.

FIGS. 14 and 15 show variations of the embodiments already described. As can be seen, the functional blocks of the embodiments can be arranged in different configurations. In FIG. 14, high voltage decoder 1140 is coupled between array 1120 and address fault detection array 1130. The system otherwise operates the same as in previous embodiments. In FIG. 15, row decoder 1110 is coupled between array 1120 and address fault detection array 1130. Address fault detection sense amplifier 1510 is coupled between array address fault detection 1130 and address fault detection circuit 1310. The system otherwise operates the same as in previous embodiments.

Figure 16:
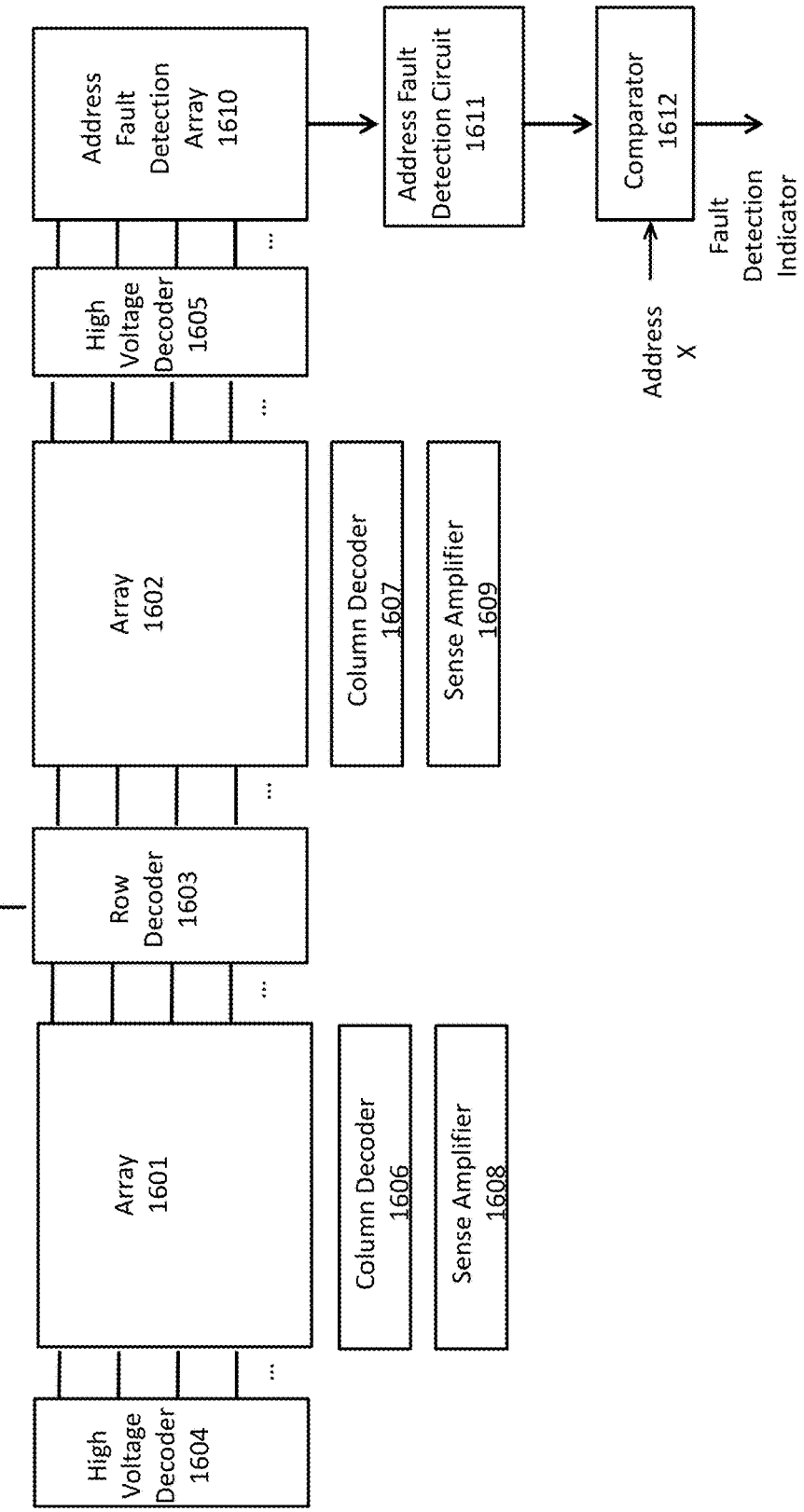
FIG. 16 depicts another embodiment of an address fault detection system.

FIG. 16 depicts memory system 1600. Here row decoder 1603 operates with two arrays, array 1601 and array 1602. Array 1601 is coupled to high voltage decoder 1604, column decoder 1606, and sense amplifier 1608. Array 1602 is coupled to high voltage decoder 1605, column decoder 1607, and sense amplifier 1609. A single address fault detection array 1610 is used. Address fault detection array 1610 is coupled to address fault detection circuit 1611 and comparator 1612 and can operate as in previously-described embodiments.

Figure 21:
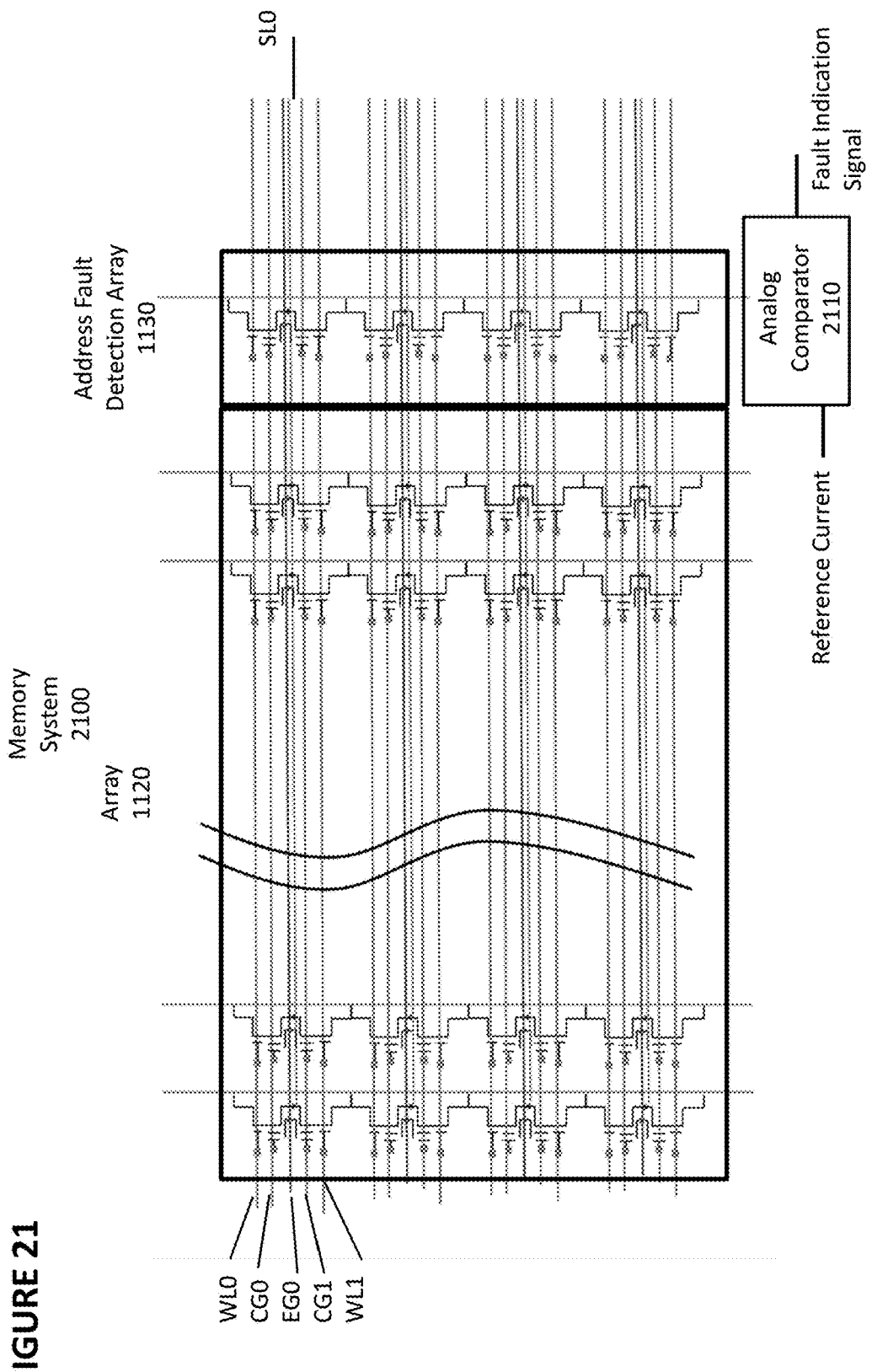
FIG. 21 depicts an embodiment of an address fault detection system.

FIG. 21 depicts memory system 2100. Memory system 2100 comprises array 1120, address fault detection array 1130, and analog comparator 2110. In this example, address fault detection array 1130 comprises a single column of flash memory or ROM cells that each store a "1" value. When a word line is asserted, the corresponding cell in that row in will output a "1," which generates a current Ir. A typical value for Ir is 20 µA. If more than one word line is asserted (which will happen when a fault causes the intended word line and an unintended word line to be asserted), then more than one cell in address fault detection array 1130 will output a "1," with the total output current being n*Ir, where n is the number of activated word lines. The output is input into analog comparator 2110. A reference current also will be input into analog comparator. An exemplary reference current is 1.3Ir. If the input from address fault detection array 1130 exceeds 1.3Ir, then the output of analog comparator 2110 will be a "1," which signifies that more than one word line is activated, which indicates a fault condition. If the input from address fault detection array 1130 is less than 1.3Ir, then the output will be a "0," which signifies that one or zero word lines are activated, which indicates a non-fault condition. (It is possible that a zero word line situation is a fault; this embodiment will not detect that condition.) It can be understood that other multiples besides 1.3 can be selected.

In some embodiments where address fault detection array 1130 comprises flash memory cells, a "1" state in a cell is an erased state (having a cell current of Ir) and a "0" state in a cell is a programmed state (having a cell current of around 0 µA). In other embodiments where address fault detection array 1130 comprises flash memory cells, a "1" in a cell is an erased state and a "0" state in the cell is a state where there is no bitline contact between the cell and the array column.

Figure 22:
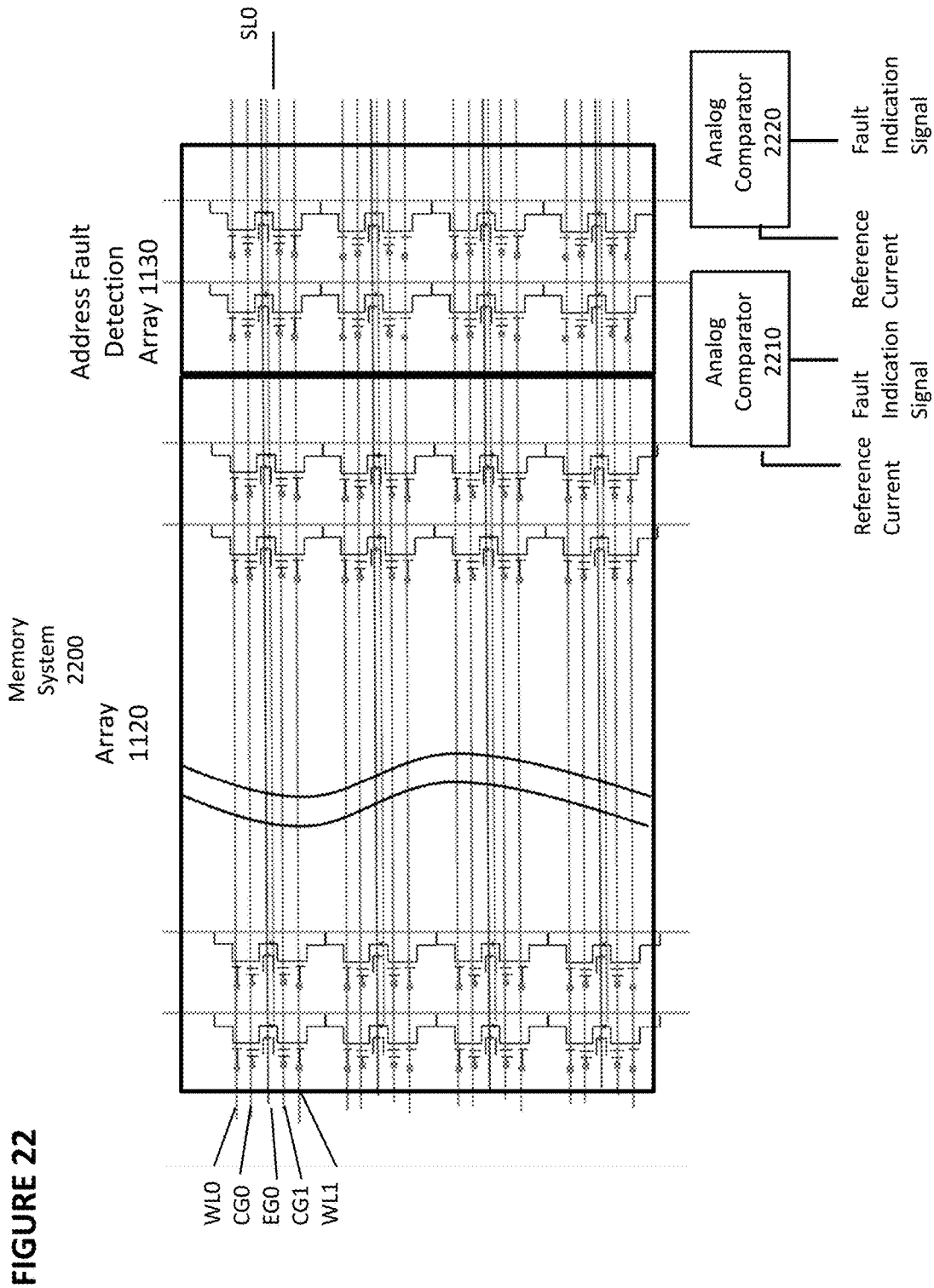
FIG. 22 depicts another embodiment of an address fault detection system.

FIG. 22 depicts memory system 2200. Memory system 2200 is similar to memory system 2100 of FIG. 21 except that it has two columns of cells in address fault detection array 1130. Memory system 2200 comprises array 1120, address fault detection array 1130, and analog comparators 2210 and 2220. In this example, address fault detection array 1130 comprises two columns of flash memory or ROM cells that each store a "1" value. When a word line is asserted, the corresponding cells in that row each will output a "1," which corresponds to a current Ir. A typical value for Ir is 20 µA. If more than one word line is asserted (which is a type of fault condition), then more than one pair of cells in address fault detection array 1130 will output a "1," with the total output current in each column being n*Ir, where n is the number of activated word lines. The output is input into analog comparators 2210 and 2220. A reference current, such as 0.5.Ir and 1.1Ir, also are inputs into analog comparators 2210 and 2220, respectively. If the input from address fault detection array 1130 exceeds 1.1Ir, then the comparator 2220 output will be a "1," which signifies that more than one word line is activated, which indicates a fault condition. If the input from address fault detection array 1130 exceeds 0.5Ir, but is less than 1.1Ir, then the comparator 2210 output will be a "1" and the comparator 2220 output will be a "0," which signifies that exactly one word line is activated, which indicates a non-fault condition. If the input from address fault detection array 1130 is less than 0.5Ir, then the comparator 2210 output will be a "0," which signifies that no word lines are activated, which indicates a fault condition. It can be understood that other multiples besides 1.1 can be selected in order to determine whether a certain number of wordlines (e.g., 3) are at fault.

Figure 23:
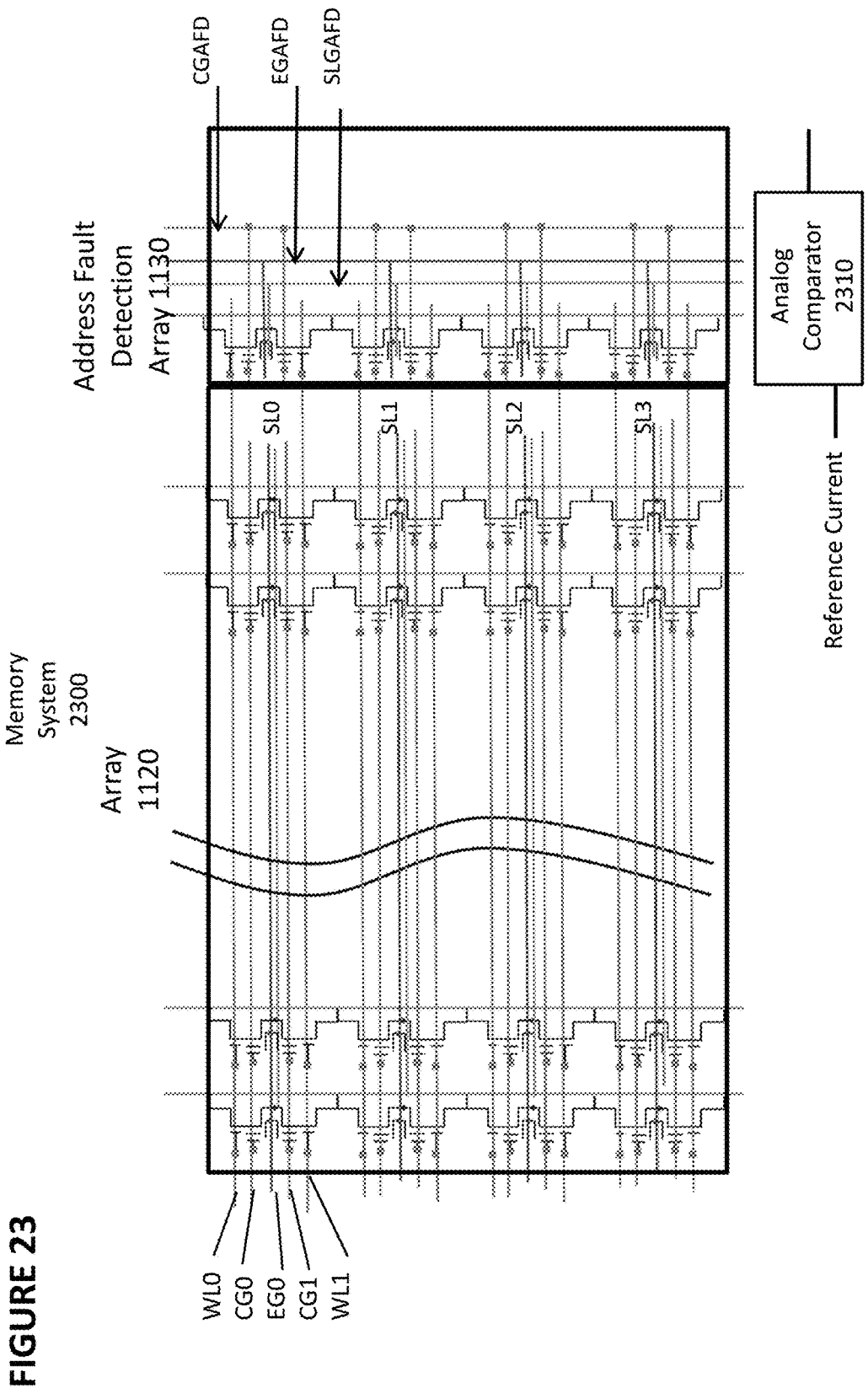
FIG. 23 depicts another embodiment of an address fault detection system.

FIG. 23 depicts memory system 2300. Memory system 2300 comprises array 1120, address fault detection array 1130, and analog comparator 2310. Memory system 2300 is the same as memory system 2100 in FIG. 21, except that address fault detection array 1130 is controlled by its own control gate signal (CGAFD), erase gate signal (EGAFD), and source line gate signal (SLGAFD). As in FIG. 21, array 1120 and address fault detection array 1130 share word lines. Thus, in this embodiment, array 1120 and address fault detection array 1130 share word lines but use separate high voltage control lines.

Figure 24:
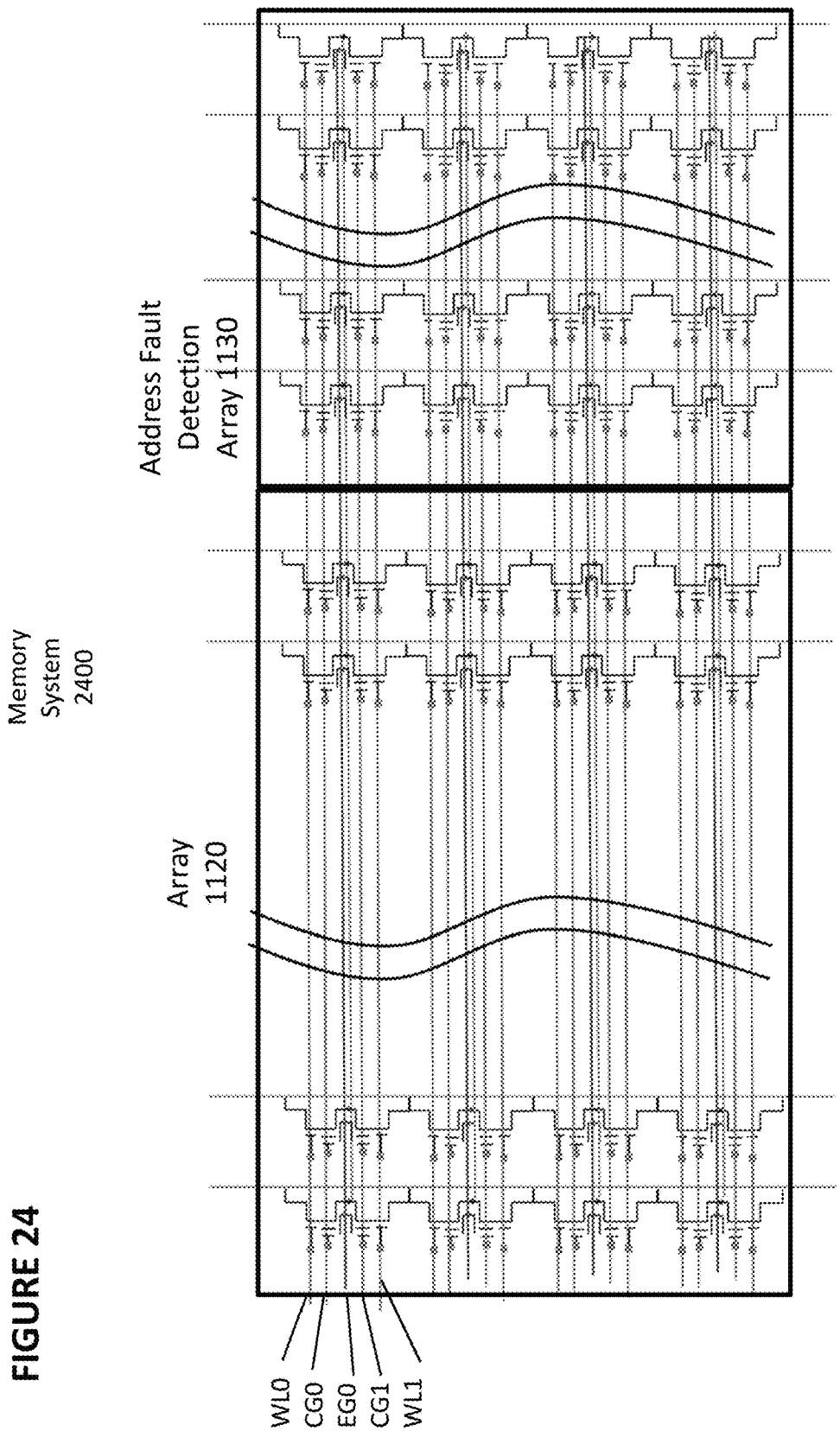
FIG. 24 depicts another embodiment of an address fault detection system.

FIG. 24 depicts memory system 2400. Memory system 2400 comprises array 1120 and address fault detection array 1130. Address fault detection array 1130 comprises one or more columns of flash memory cells. Because array 1120 and address fault detection array 1130 share word lines and high voltage control lines (control gate, erase gate, and source line gate signals), the cells in a particular row of address fault detection array 1130 will be erased when the cells in that same row are erased in array 1120. Therefore, the appropriate values will need to be programmed into each erased row in address fault detection array 1130 by a controller or other device following an erase operation. Certain columns in address fault detection array 1130 contain the encoded validation bits for the row portion and/or column of each possible address, using the encoding schemes of FIGS. 17-20 or another encoding scheme.

Figure 25:
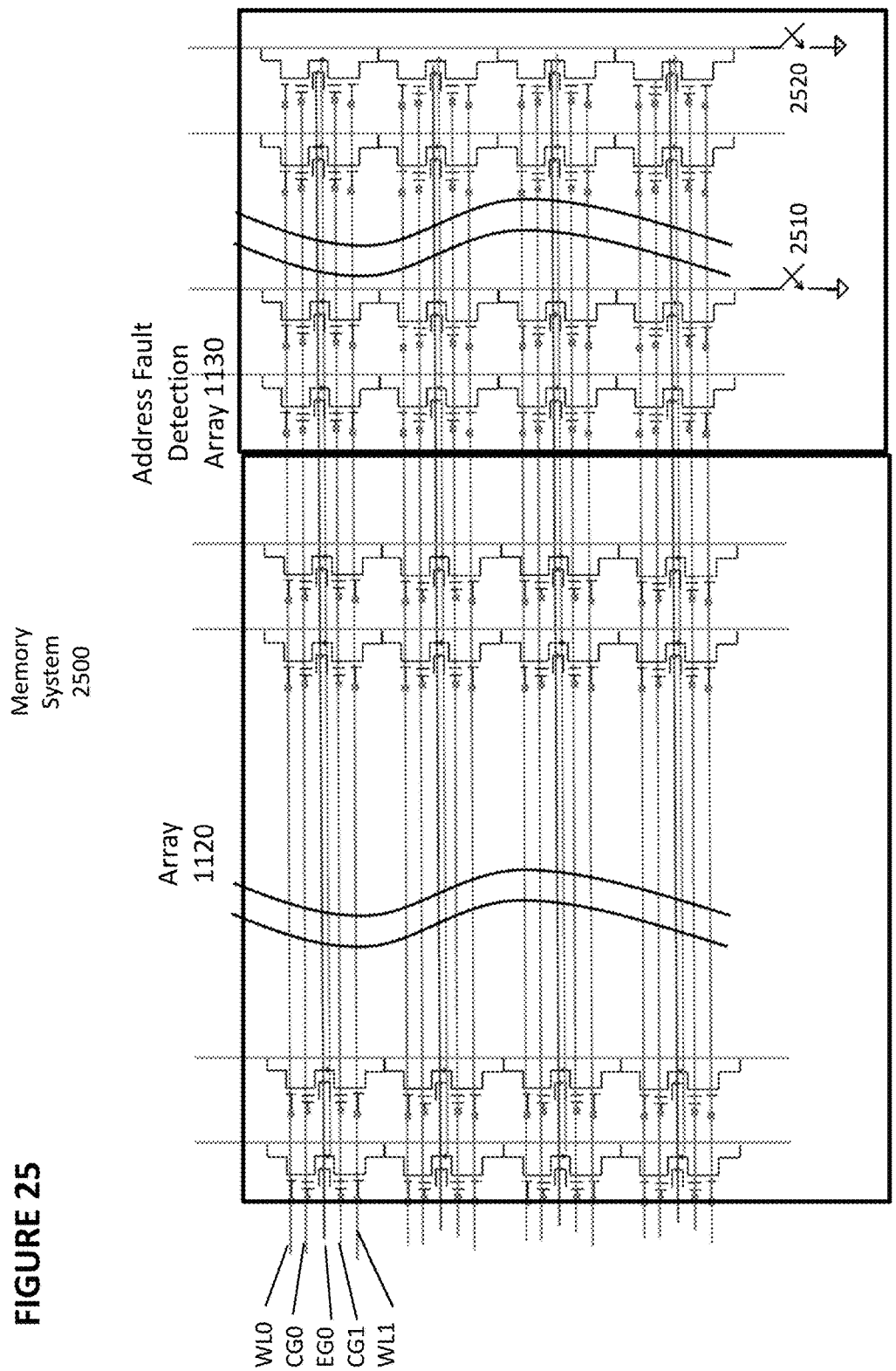
FIG. 25 depicts another embodiment of an address fault detection system.

FIG. 25 depicts memory system 2500. Memory system 2500 comprises array 1120 and address fault detection array 1130. Address fault detection array 1130 comprises one or more columns of flash memory cells. Memory system 2500 is identical to memory system 2400 except that memory system 2500 comprises circuits 2510 and 2520, which pull down one or more bit lines to ground during a power down operation. It is to be understood that memory system 2500 can comprises on such circuit for each column in address fault detection array 1130 or a lesser amount. Certain columns in address fault detection array 1130 contain the encoded validation bits for the row portion and/or column of each possible address, using the encoding schemes of FIGS. 17-20 or another encoding scheme.

Figure 26:
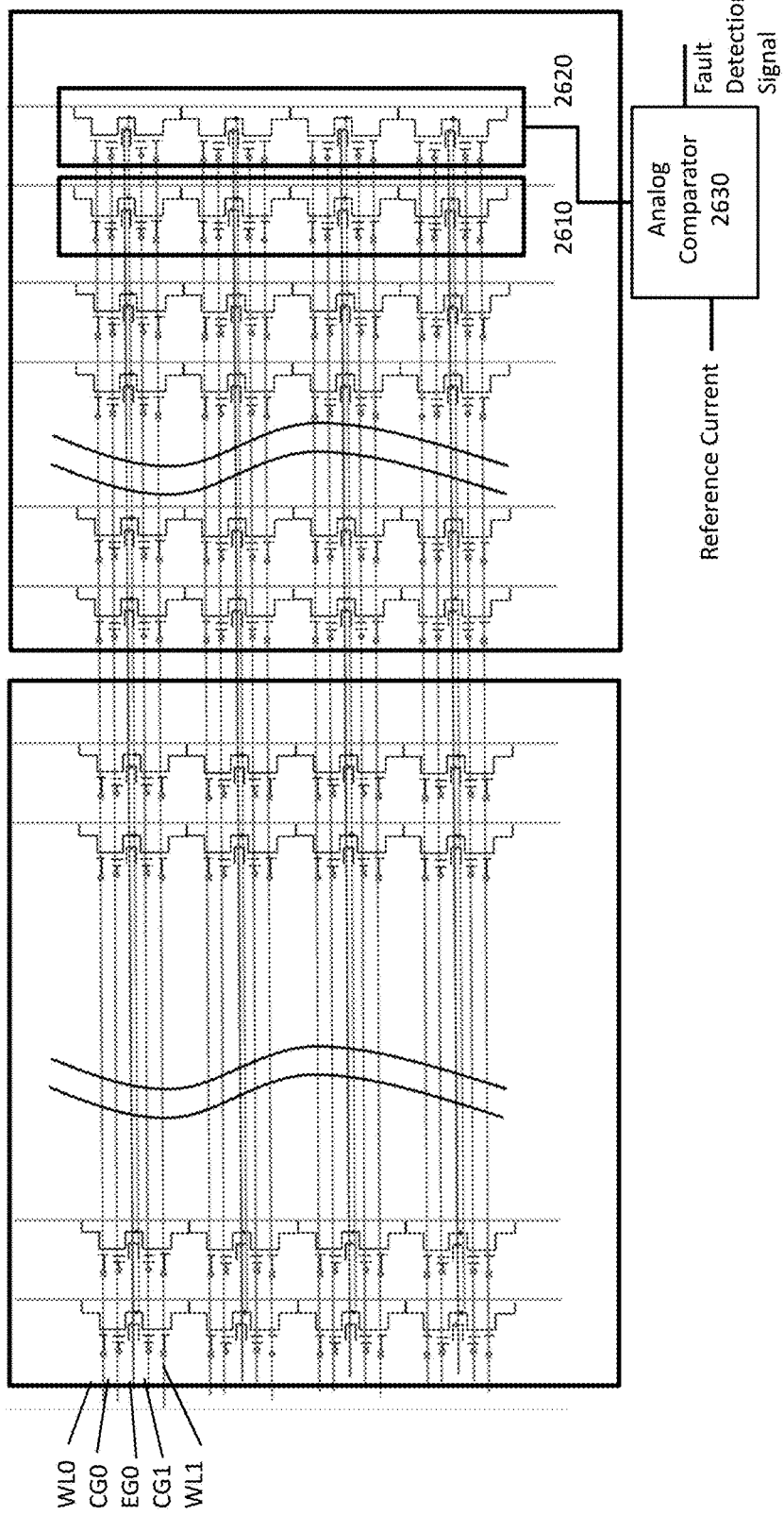
FIG. 26 depicts another embodiment of an address fault detection system.

FIG. 26 depicts memory system 2600. Memory system 2600 comprises array 1120, address fault detection array 1130, and analog comparator 2630. Address fault detection array 1130 comprises one or more columns of flash memory cells. Memory system 2600 is identical to memory system 2500 except that memory system 2600 comprises polarity column 2610 and multiple row detection MRD column 2620. Polarity column 2610 contains a single bit for each row to perform the function of the PB bit in FIG. 18. Multiple row detection column 2620 contains a single cell for each row that stores a "1." This column implements the functionality described previously as to FIG. 21. Other columns in address fault detection array 1130 contain the encoded validation bits for the row portion and/or column of each possible address, using the encoding schemes of FIGS. 17-20 or another encoding scheme.

In all of the embodiments described herein, when a fault is indicated, the memory system can take appropriate steps. For instance, the memory system can ignore the results of any read operation that was impacted by the fault and can repeat the read operation. The memory system also can repeat any write operation that was impacted by a fault. In the situation where array 1120 comprises flash memory cells, memory system can first erase the relevant portion of the array before repeating the write (program) operation.

Figure 27:
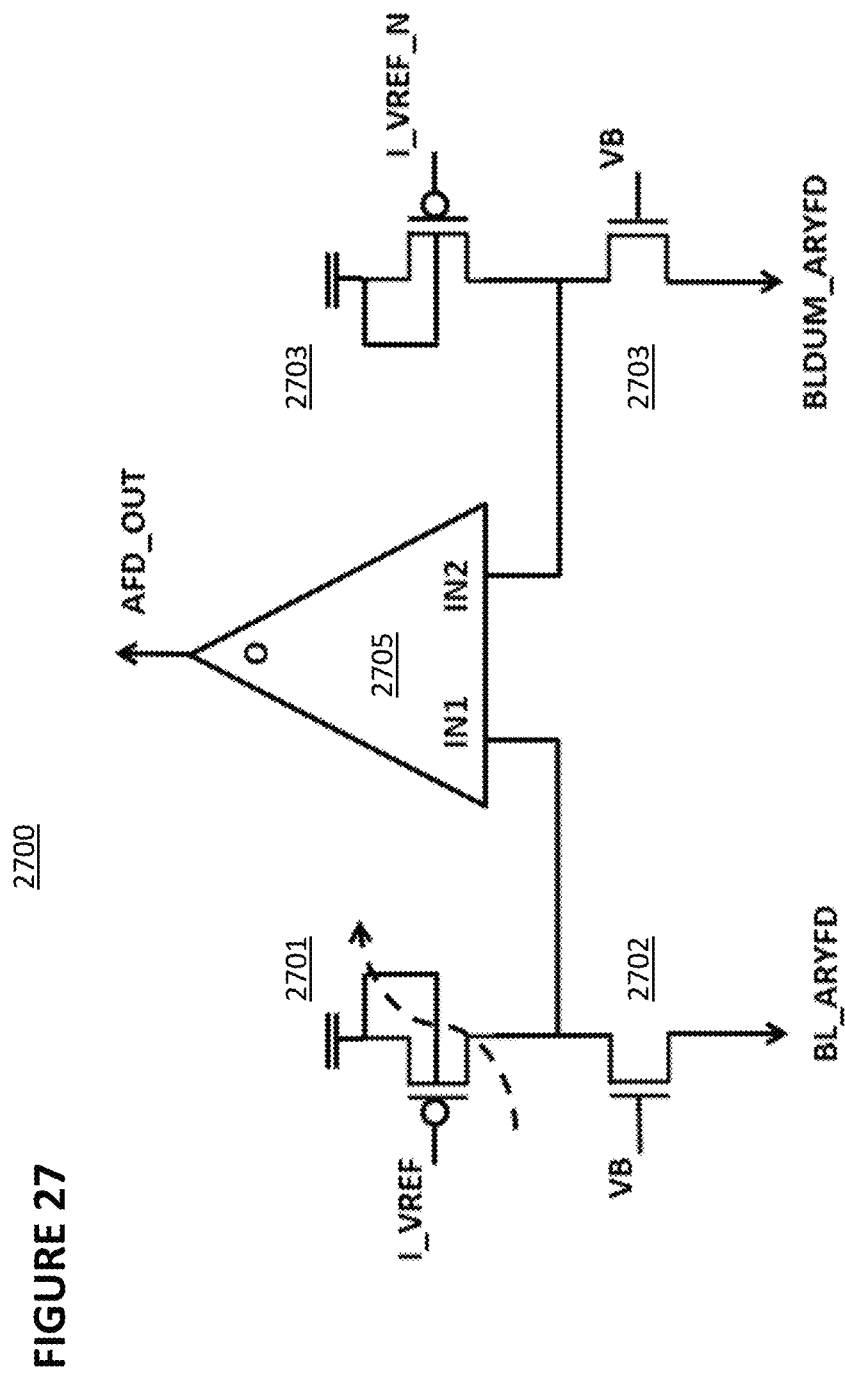
FIG. 27 depicts an embodiment of a sense circuit for use in the embodiments of an address fault detection system.

FIG. 27 depicts an embodiment of a sensing circuit. Sensing circuit 2700 comprises bias transistors 2702 and 2703, current source transistors 2701 and 2703, and comparator 2705. Bias transistor 2702 connects to a bit line (column) in address fault detection array 1130. Bias transistor 2703 connects to a dummy bit line or a reference current generator.

Different configurations can be selected by choosing the appropriate transistors for current source transistors 2701 and 2703. In one configuration, the output of comparator 2705 will indicate if one word line is asserted or not. Current source transistors 2701 and 2703 are selected to generate a current equal to 0.5*IR, where IR is the current drawn by a single cell when the word line is asserted. In this configuration, and output of "0" from comparator 2705 indicates no word lines are asserted, and an output of "1" indicates one word line is asserted.

In another configuration, the output of comparator 2705 will indicate if more than one word line is asserted or not. Current source transistors 2701 and 2703 are selected to generate a current equal to 1.1*IR, where IR is the current drawn by a single cell when the word line is asserted. In this configuration, and output of "0" from comparator 2705 indicates one word line or fewer are asserted, indicates that more than one word line is asserted.

Figure 28:
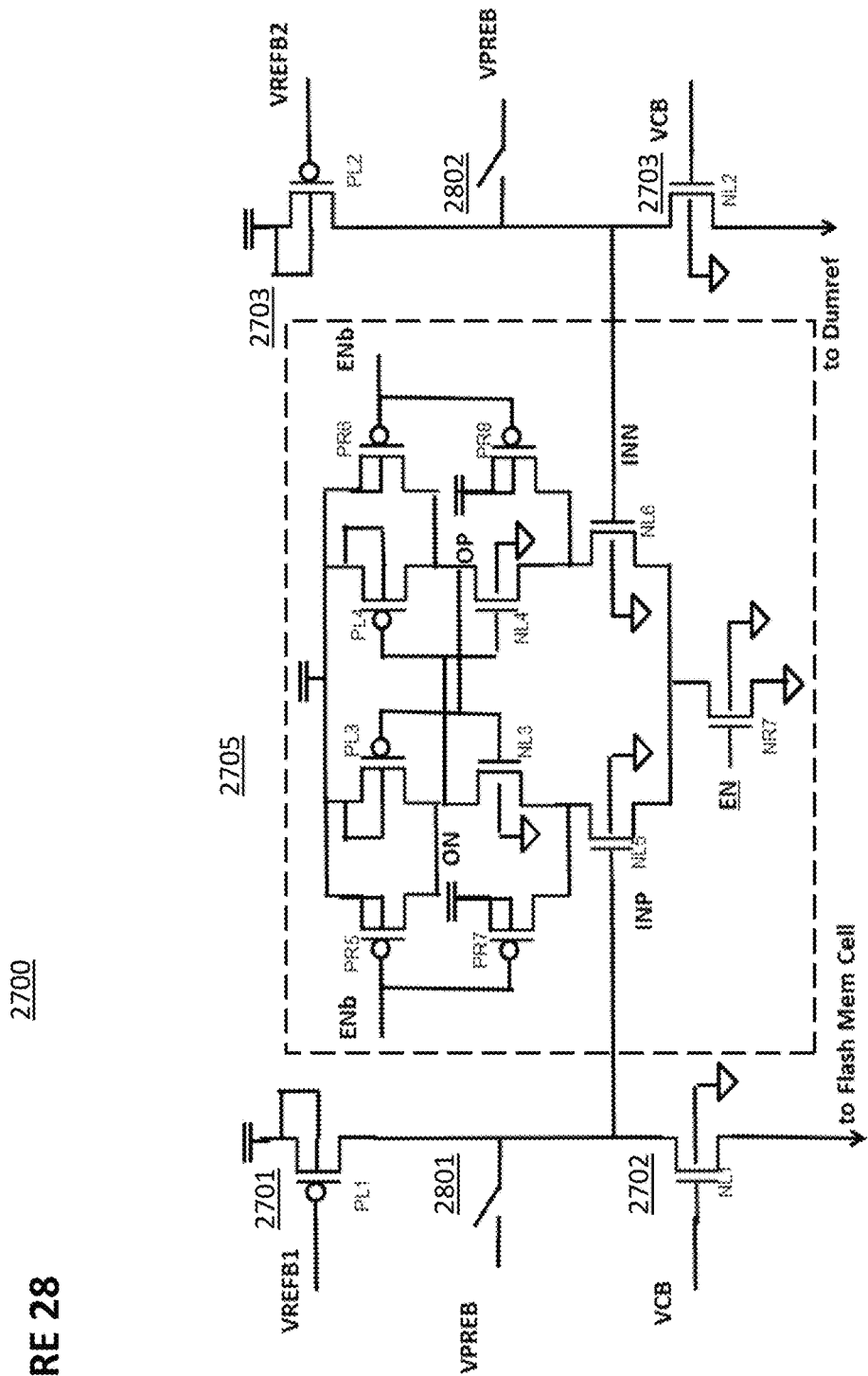
FIG. 28 depicts an embodiment of a comparator used in the sense circuit of FIG. 27.

FIG. 28 depicts additional detail of sensing circuit 2700. Bias switches 2801 and 2802 also are depicted.

Figure 29:
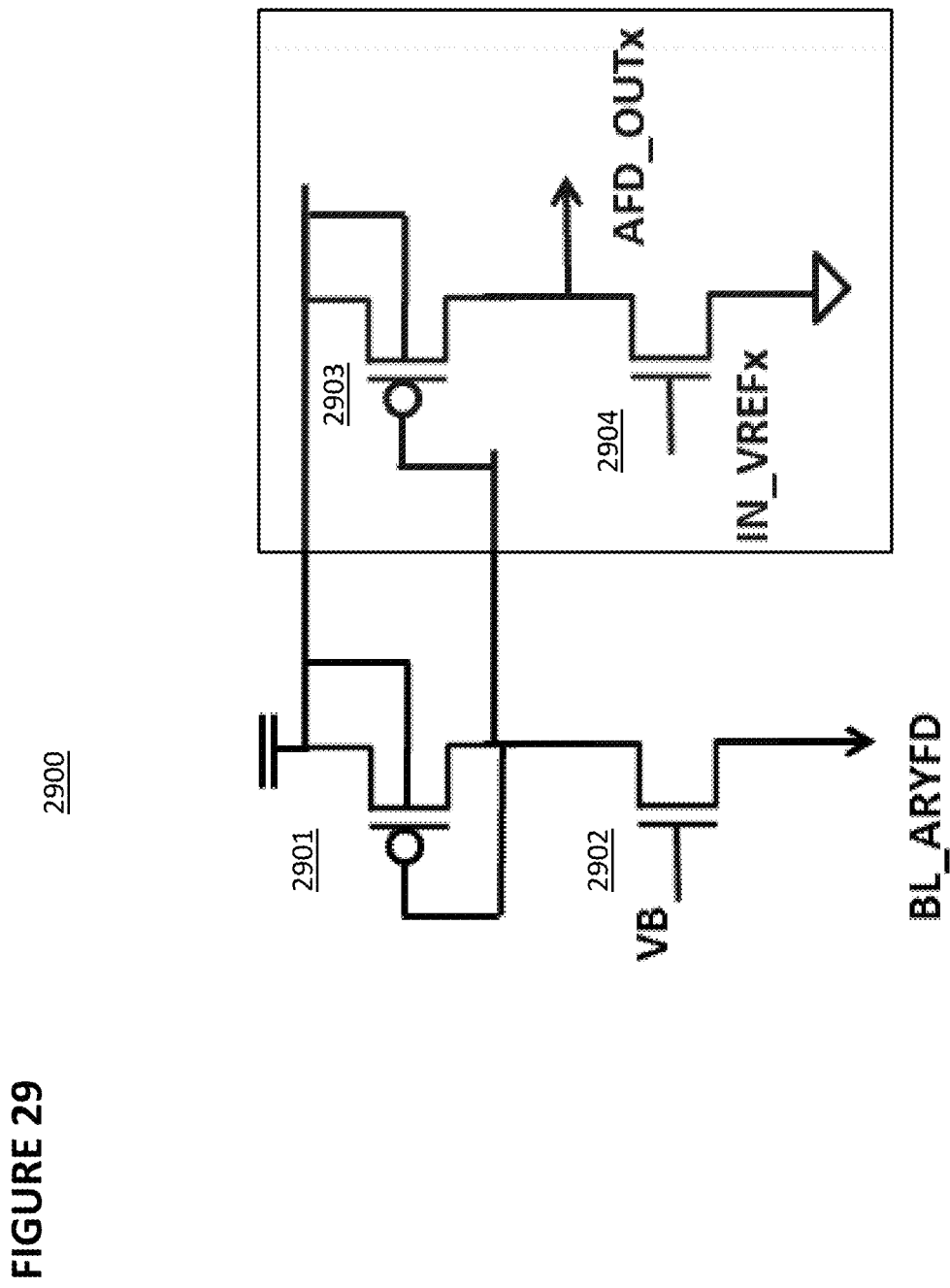
FIG. 29 depicts another embodiment of a sense circuit for use in the embodiments of an address fault detection system.

FIG. 29 depicts another embodiment of a sensing circuit. Sensing circuit 2900 comprises bias transistors 2902 and 2904 and current mirror transistors 2901 and 2903. Bias transistor 2902 connects to a bit line (column) in address fault detection array 1130. Bias transistor 2904 connects to ground. The output will indicate whether a "1" or "0" is being output on that bit line from address fault detection array 1130.

Figure 30:
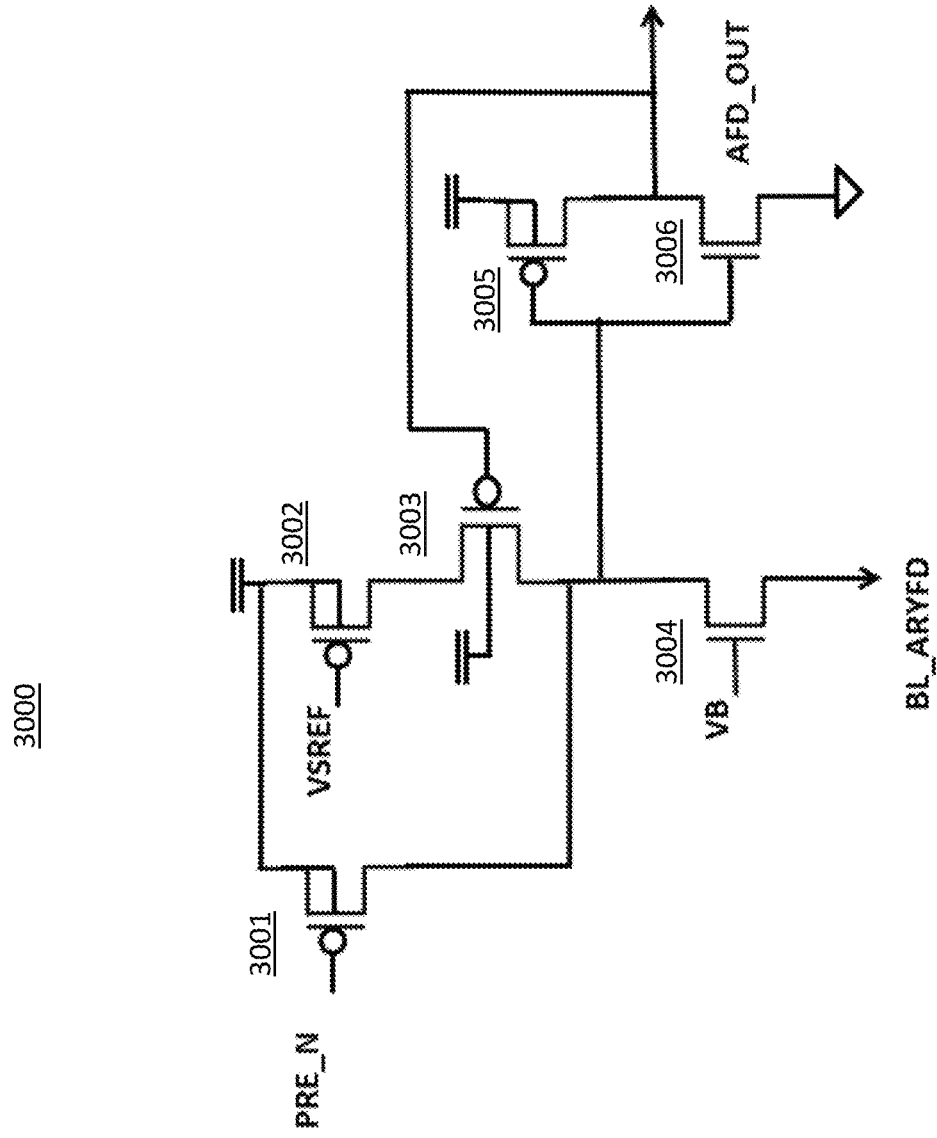
FIG. 30 depicts another embodiment of a sense circuit for use in the embodiments of an address fault detection system.

FIG. 30 depicts another embodiment of a sensing circuit. Sensing circuit 3000 comprises bias transistors 3004 and 3006, current mirror transistors 3001 and 3005, and transistors 3002 and 3003. Bias transistor 3004 connects to a bit line (column) in address fault detection array 1130. Bias transistor 3006 connects to ground. The output will indicate whether a "1" or "0" is being output on that bit line from address fault detection array 1130.

Figure 31:
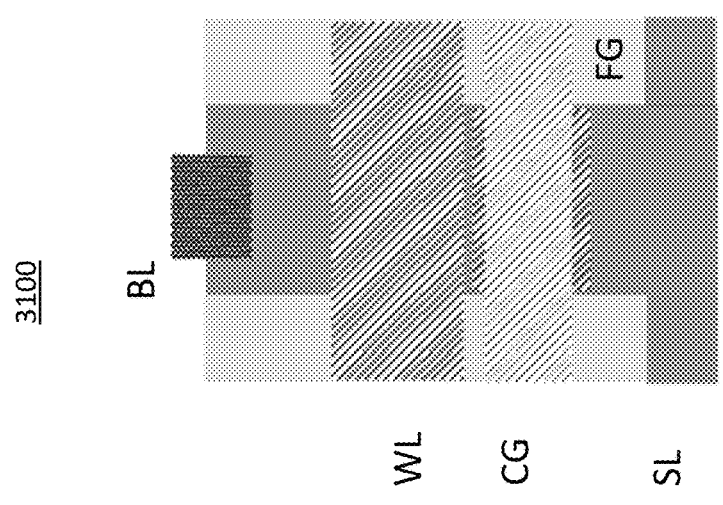
FIG. 31 depicts a layout of a flash memory cell for use in the embodiments.

FIG. 31 depicts a layout for flash memory cell 3100 that can be used in address fault detection array 1130. Flash memory cell 3100 follows the architecture of memory cell 10 in FIG. 1.

Figure 32:
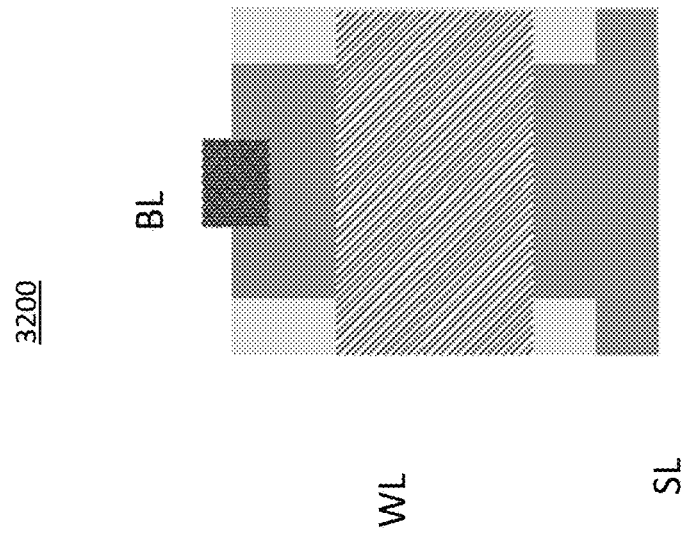
FIG. 32 depicts a layout of a flash memory cell configured as a ROM cell for use in the embodiments.

FIG. 32 depicts a layout for ROM cell 3200 that can be used in address fault detection array 1130. ROM memory cell 3200 follows the architecture of memory cell 10 in FIG. 1 but is modified to operate as a ROM cell.

Figure 33:
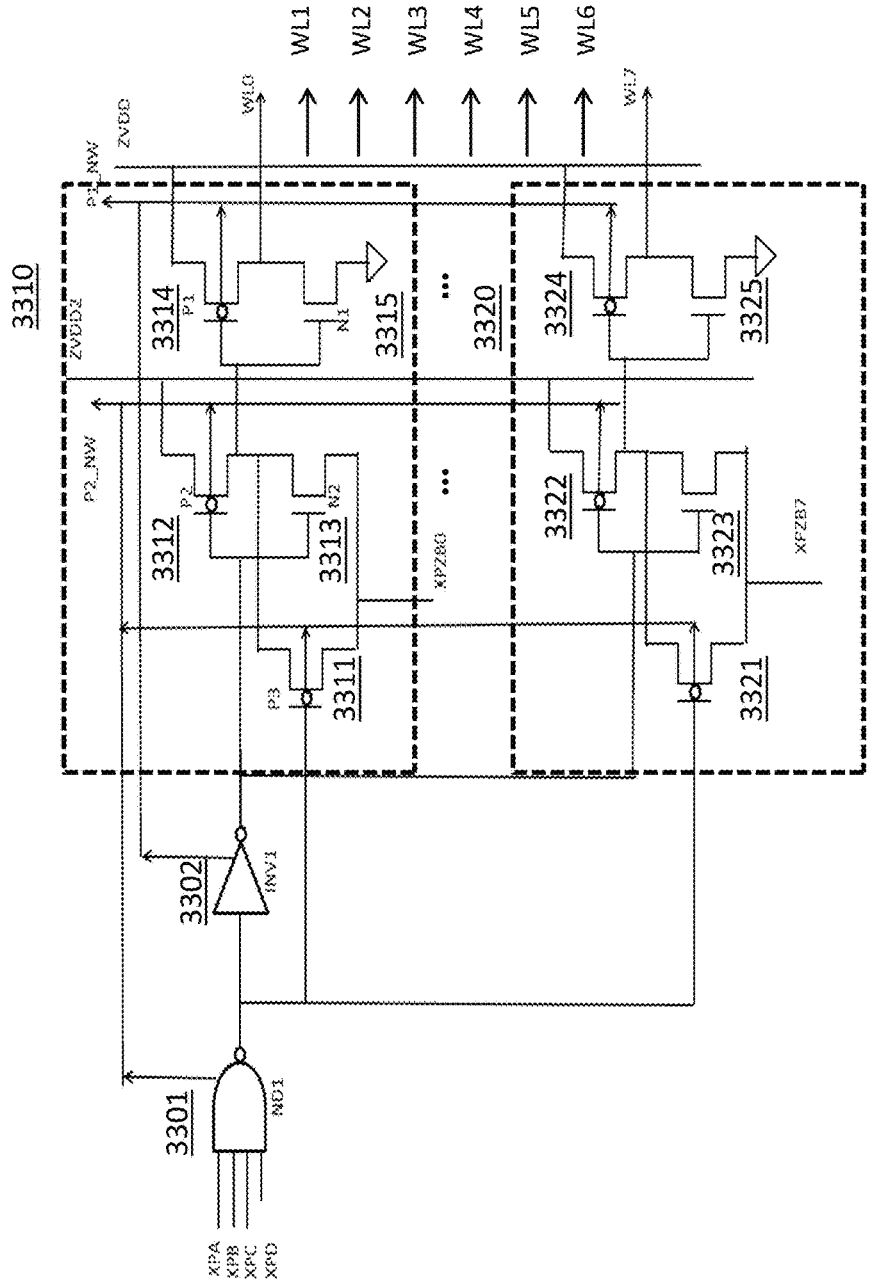
FIG. 33 depicts an embodiment of a row decoder for use with the embodiments of an address fault detection system.

FIG. 33 depicts row decoder 3300 for 8 word lines in a sector within a memory array (such as memory array 1001, 1002, 1003, and 1004). Row decoder 3300 can be used for row decoder 1110 in the embodiments described above. Row decoder 3300 comprises NAND gate 3301, which receives pre-decoded address signals, here shown as lines XPA, XPB, XPC, and XPD, which select a sector within a memory array. When XPA, XPB XPC, and XPD are all "high," then the output of NAND gate 3301 will be "low" and this particular sector will be selected.

Row decoder 3300 further comprises inverter 3302, decoder circuit 3310 to generate word line WL0, decoder circuit 3320 to generate WL7, as well as additional decoder circuits (not shown) to generate word lines WL1, WL2, WL3, WL4, WL5, and WL6.

Decoder circuit 3310 comprises PMOS transistors 3311, 3312, and 3314 and NMOS transistors 3313 and 3315, configured as shown. Decoder circuit 3310 receives the output of NAND gate 3301, the output of inverter 3302, and pre-decoded address signal XPZB0. When this particular sector is selected and XPZB0 is "low," then WL0 will be asserted. When XPZB0 is "high," then WL0 will not be asserted.

Similarly, decoder circuit 3320 comprises PMOS transistors 3321, 3322, and 3324 and NMOS transistors 3323 and 3325, configured as shown. Decoder circuit 3320 receives the output of NAND gate 3301, the output of inverter 3302, and pre-decoded address signal XPZB7. When this particular sector is selected and XPZB7 is "low," then WL7 will be asserted. When XPZB7 is "high," then WL7 will not be asserted.

It is to understood that the decoder circuits (now shown) for WL1, WL2, and WL3, WL4, WL5, and WL6 will follow the same design as decoder circuits 3310 and 3320 except that they will receive the inputs XPZB1, XPZB2, XPZB3, XPZB4, XPZB5, and XPZB6, respectively, instead of XPZB0 or XPZB7.

In the situation where this sector is selected and it is desired for WL0 to be asserted, the output of NAND gate 3301 will be "low," and the output of inverter will be "high." PMOS transistor 3311 will be turned on, and the node between PMOS transistor 3312 and NMOS transistor 3313 will receive the value of XPZB0, which will be "low" when word line WL0 is to be asserted. This will turn on PMOS transistor 3314, which will pull WL0 "high" to ZVDD which indicates an asserted state. In this instance, XPZB7 is "high," signifying that WL7 is to be not asserted, which will pull the node between PMOS transistor 3322 and NMOS transistor 3323 to the value of XPZB7 (which is "high"), which will turn on NMOS transistor 3325 and cause WL to be "low," which indicates a non-asserted state. In this manner, one of the word lines WL0 . . . WL7 can be selected when this sector is selected.

Figure 34:
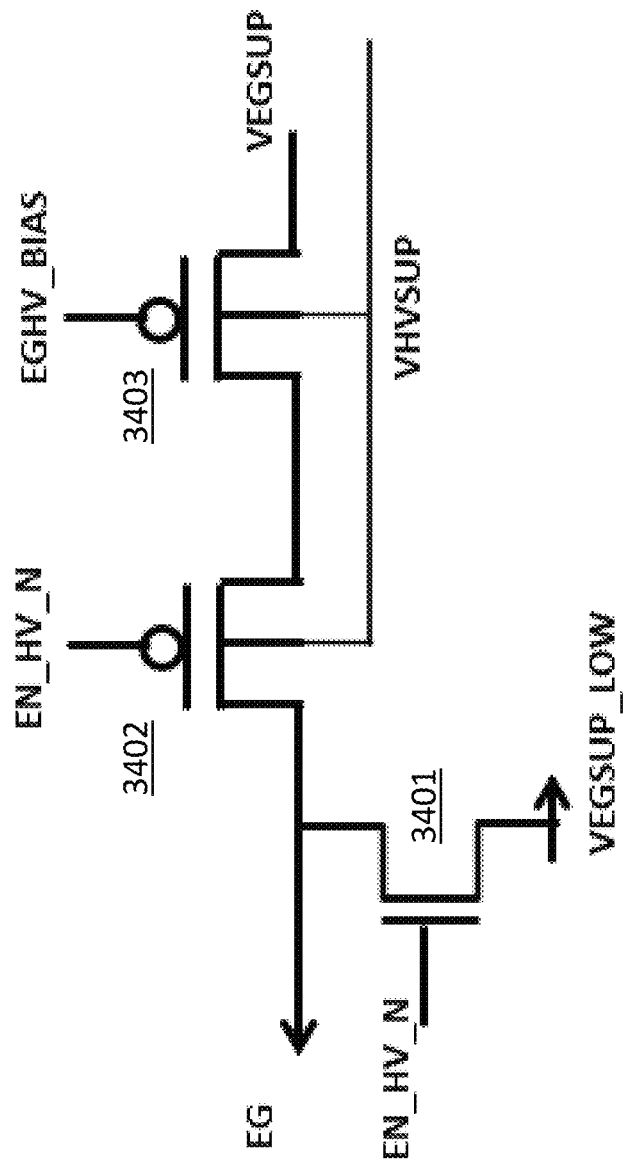
FIG. 34 depicts an embodiment of an erase gate decoder for use with the embodiments of an address fault detection system.

FIG. 34 shows erase gate decoder 3400 as part of the high voltage decoders 1018-1021. Erase gate decoder 3400 comprises NMOS transistor 3401 and PMOS transistors 3402 and 3403, configured as shown. PMOS transistor 3403 is a current limiter with EGHV_BIAS as a current mirror bias level. When this erase gate signal (EG) is to be asserted, EN_HV_N will be low (e.g., 0V or 1.2V or 2.5V), which will turn on PMOS transistor 3402 and turn off NMOS transistor 3401, which will cause erase gate (EG) to be high (i.e. =VEGSUP, for example 11.5V). When this erase gate signal (EG) is to be not asserted, EN_HV_N will be high, which will turn off PMOS transistor 3402 and turn on NMOS transistor 3401, which will cause erase gate (EG) to be low (i.e., =VEGSUP_LOW level, for example 0v or 1.2V or 2.5V).

Figure 35:
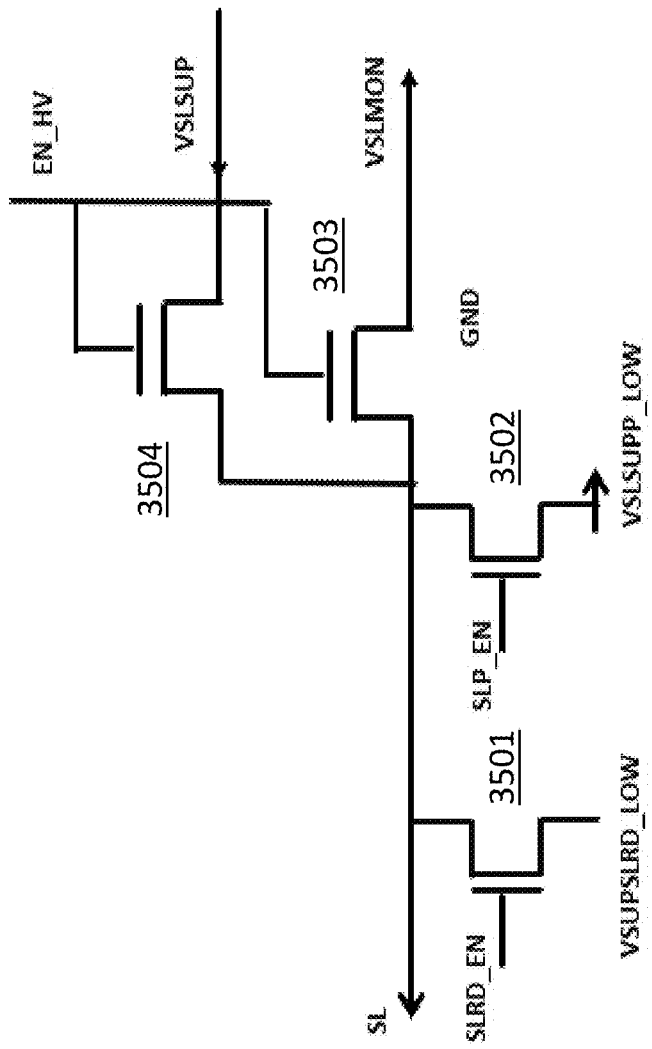
FIG. 35 depicts an embodiment of a source line decoder for use with the embodiments of an address fault detection system.

FIG. 35 shows source line decoder 3500 as part of high voltage decoders 1018-1021. Source line decoder 3500 comprises NMOS transistors 3501, 3502, 3503, and 3504, configured as shown. NMOS transistor 3501 pulls the source line (SL) low during a read operation in response to the SLRD_EN signal. NMOS transistor 3502 pulls the source line (SL) low during a programming operation in response to the SLP_EN signal. NMOS transistor 3503 performs a monitoring function, through output VSLMON. NMOS transistor 3504 provides a voltage to source line (SL) in response to the EN_HV signal.

Figure 36:
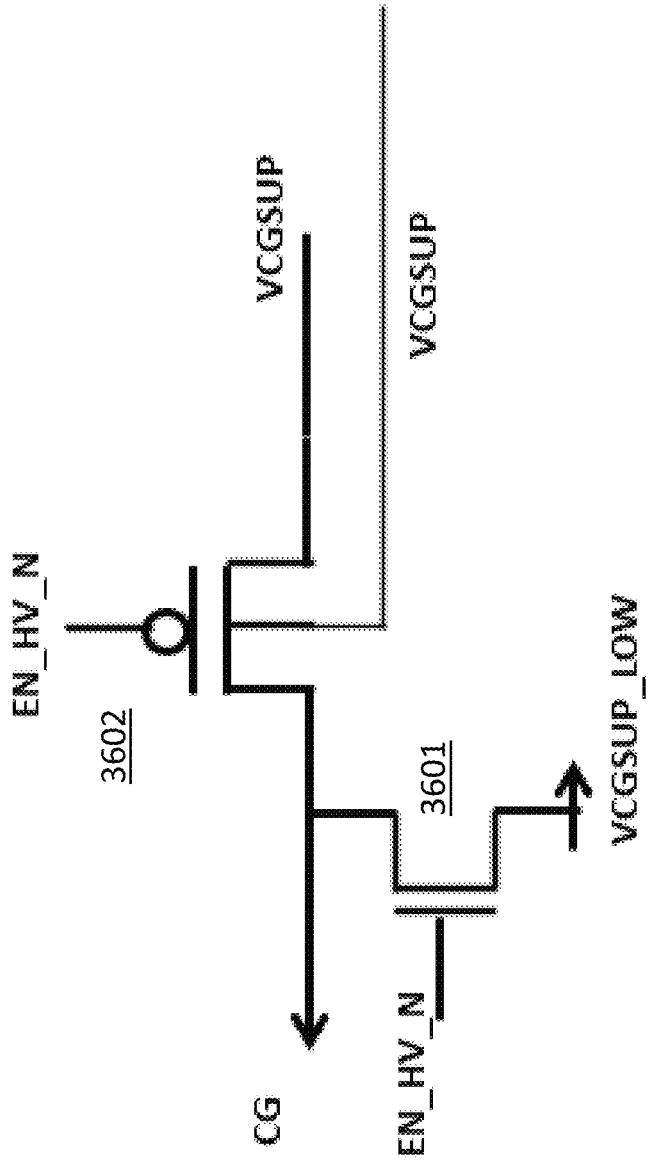
FIG. 36 depicts an embodiment of a control gate decoder for use with the embodiments of an address fault detection system.

FIG. 36 depicts control gate decoder 3600 as part of high voltage decoders 1018-1021. Control gate decoder 3600 comprises NMOS transistor 3601 and PMOS transistor 3602. NMOS transistor 3601 will pull down the control gate signal (CG) in response to the signal EN_HV_N. PMOS transistor 3602 will pull up the control gate signal (CG) in response to the signal EN_HV_N.

Figure 37:
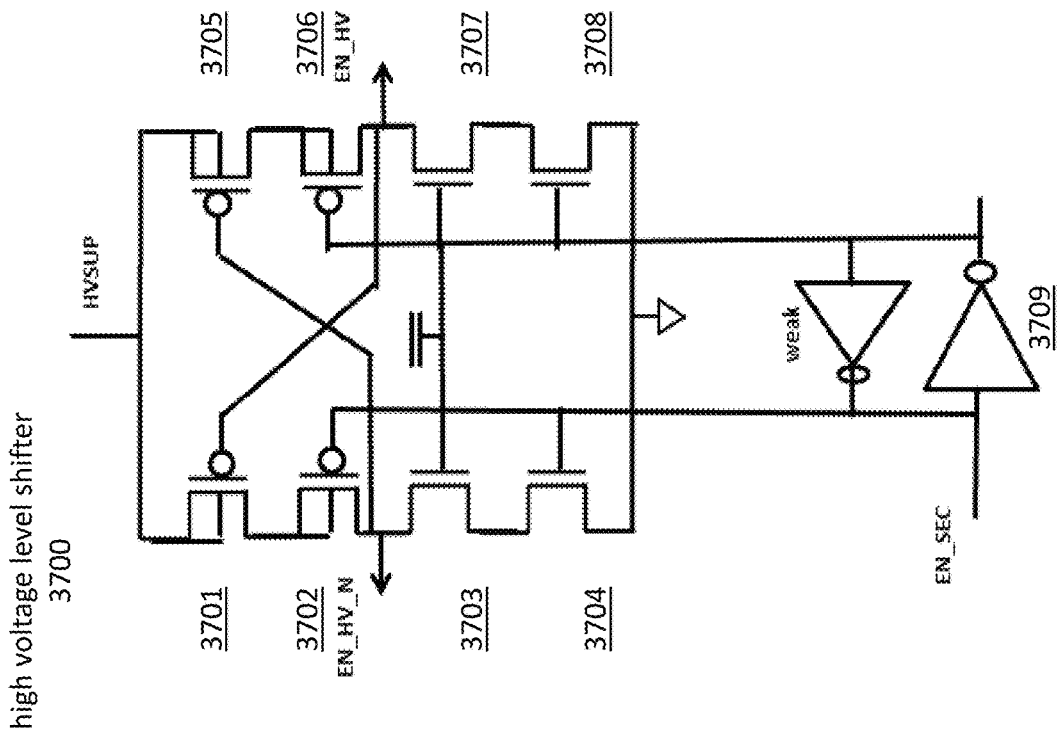
FIG. 37 depicts an embodiment of a high voltage level shifter use with the embodiments of an address fault detection system.

FIG. 37 depicts latch voltage shifter 3700 as part of high voltage decoders 1018-1021. Latch voltage shifter 3700 comprises low voltage latch inverter 3709, NMOS transistors 3703, 3704, 3707, and 3708, and PMOS transistors 3701, 3702, 3705, and 3706, in the configuration shown. Latch voltage shifter 1800 receives EN_SEC as an input and outputs EN_HV and EN_HV_N, which have a larger voltage swing than EN_SEC and ground.

What is claimed is:
1. A flash memory system, comprising:
a memory array comprising flash memory cells arranged in rows and columns;
a row decoder for receiving a row address as an input, the row decoder coupled to a plurality of word lines, wherein each word line is coupled to a row of flash memory cells in the memory array;
an address fault detection array comprising memory cells arranged in rows and columns, wherein each of the plurality of word lines is coupled to a row in the address fault detection array; and
a comparator for comparing a row address received by the row decoder with a value output from the address fault detection array in response to an assertion of a word line by the row decoder and for indicating a fault if the compared values are different and for indicating a fault in response to the assertion of multiple word lines by the row decoder;
wherein the address fault detection array comprises a column of cells, wherein a first value in a cell indicates that bits in a row containing that cell were stored in an inverted manner and a second value in the cell indicates that bits in the row containing that cell were stored in a non-inverted manner.
2. The system of claim 1, wherein each flash memory cell in the memory array is a split gate flash memory cell.

3. The system of claim 1, wherein each memory cell in the address fault detection array is a split gate flash memory cell.

4. The system of claim 1, wherein each memory cell in the address fault detection array is a ROM cell.

5. The system of claim 1, wherein each flash memory cell in the memory array is programmed through a source side hot electron programming mechanism.

6. The system of claim 1, wherein each memory cell in the address fault detection array is a flash memory cell programmed through a source side hot electron programming mechanism.

7. The system of claim 1, wherein each flash memory cell in the memory array comprises a floating gate and an erase gate, wherein a top corner of the floating gate protrudes towards an inside corner of the erase gate to enhance erase efficiency.

8. The system of claim 1, wherein each memory cell in the address fault detection array is a flash memory cell comprising a floating gate and an erase gate, wherein a top corner of the floating gate protrudes towards an inside corner of the erase gate to enhance erase efficiency.

9. The system of claim 1, wherein for each flash memory cell in the memory array, an erased state in a flash memory cell represents a "1" value and a programmed state in a flash memory cell represents a "0" value.

10. The system of claim 1, wherein each memory cell in the address fault detection array is a flash memory cell and an erased state in the flash memory cells represents a "1" value and a programmed state in the flash memory cells represents a "0" value.

11. The system of claim 1, wherein the memory array and the address fault detection array are coupled to shared word lines and are coupled to different control gate lines, erase gate lines, and source lines.

12. The system of claim 1, further comprising a sensing circuit for reading data in the address fault detection array.

13. The system of claim 12, wherein the sensing circuit is a differential sensing circuit.

14. The system of claim 12, wherein the sensing circuit is a single ended sensing circuit.

15. A flash memory system, comprising:
a memory array comprising flash memory cells arranged in rows and columns;
a row decoder for receiving a row address as an input, the row decoder coupled to a plurality of word lines, wherein each word line is coupled to a row of flash memory cells in the memory array;
an address fault detection array comprising memory cells arranged in rows and columns, wherein each of the plurality of word lines is coupled to a row in the address fault detection array; and
a comparator for comparing a row address received by the row decoder with a value output from the address fault detection array in response to an assertion of a word line by the row decoder and for indicating a fault if the compared values are different and for indicating a fault in response to the assertion of multiple word lines by the row decoder;
wherein for each "0" bit in a row address, the address fault detection array stores a value of "01," and for each "1" bit in a row address, the address fault detection array stores a value of "10".

16. A flash memory system, comprising:
a memory array comprising flash memory cells arranged in rows and columns;
a row decoder for receiving a row address as an input, the row decoder coupled to a plurality of word lines, wherein each word line is coupled to a row of flash memory cells in the memory array;
an address fault detection array comprising memory cells arranged in rows and columns, wherein each of the plurality of word lines is coupled to a row in the address fault detection array; and
a comparator for comparing a row address received by the row decoder with a value output from the address fault detection array in response to an assertion of a word line by the row decoder and for indicating a fault if the compared values are different and for indicating a fault in response to the assertion of multiple word lines by the row decoder;
wherein for each "0" bit in a row address, the address fault detection array stores a value of "10," and for each "1" bit in a row address, the address fault detection array stores a value of "01".

17. A flash memory system, comprising:
a memory array comprising flash memory cells arranged in rows and columns;
a row decoder for receiving a row address as an input, the row decoder coupled to a plurality of word lines, wherein each word line is coupled to a row of flash memory cells in the memory array;
an address fault detection array comprising memory cells arranged in rows and columns, wherein each of the plurality of word lines is coupled to a row in the address fault detection array; and
a comparator for comparing a row address received by the row decoder with a value output from the address fault detection array in response to an assertion of a word line by the row decoder and for indicating a fault if the compared values are different and for indicating a fault in response to the assertion of multiple word lines by the row decoder;
wherein the address fault detection array comprises one or more source line transistors that pull one or more columns in the address fault detection array to ground during a power-down operation.

18. A flash memory system, comprising:
a memory array comprising flash memory cells arranged in rows and columns;
a row decoder for receiving a row address as an input, the row decoder coupled to a plurality of word lines, wherein each word line is coupled to a row of flash memory cells in the memory array;
an address fault detection array comprising memory cells arranged in rows and columns, the columns comprising an indicator column, wherein each of the plurality of word lines is coupled to a row in the address fault detection array and each memory cell in an indicator column stores the same value;
a first comparator for comparing a row address received by the row decoder with a value output from the address fault detection array in response to an assertion of a word line by the row decoder and for indicating a fault if the compared values are different; and
a second comparator for comparing a current drawn by the indicator column with a reference current and for indicating a fault if the current drawn by the indicator column exceeds the reference current.

19. The system of claim 18, wherein for each "0" bit in a row address, the address fault detection array stores a value of "01," and for each "1" bit in a row address, the address fault detection array stores a value of "10".

20. The system of claim 18, wherein the address fault detection array comprises a column of cells, wherein a first value in a cell indicates that bits in a row containing that cell were stored in an inverted manner and a second value in the cell indicates that bits in the row containing that cell were stored in a non-inverted manner.

21. The system of claim 18, wherein the address fault detection array comprises a column of cells, each cell storing a "1" value.

22. The system of claim 18, wherein each flash memory cell in the memory array is a split gate flash memory cell.

23. The system of claim 18, wherein each memory cell in the address fault detection array is a ROM cell.

24. A flash memory system, comprising:
a memory array comprising flash memory cells arranged in rows and columns;
a column decoder for receiving a column address as an input, the column decoder coupled to a plurality of bit lines, wherein each bit line is coupled to a column of flash memory cells in the memory array;
an address fault detection array comprising memory cells arranged in rows and columns, wherein each of the plurality of bit lines is coupled to a row in the address fault detection array; and
a comparator for comparing a column address received by the column decoder with a value output from the address fault detection array in response to an assertion of a bit line by the column decoder and for indicating a fault if the compared values are different and for indicating a fault in response to the assertion of multiple bit lines by the column decoder;
wherein the address fault detection array comprises a column of cells, wherein a first value in a cell indicates that bits in a row containing that cell were stored in an inverted manner and a second value in the cell indicates that bits in the row containing that cell were stored in a non-inverted manner.

25. The system of claim 24, wherein the address fault detection array comprises a column of cells, each cell storing a '1' value.

26. The system of claim 24, wherein each flash memory cell in the memory array is a split gate flash memory cell.

27. The system of claim 24, wherein each memory cell in the address fault detection array is a ROM cell.

28. A flash memory system, comprising:
a memory array comprising flash memory cells arranged in rows and columns;
a column decoder for receiving a column address as an input, the column decoder coupled to a plurality of bit lines, wherein each bit line is coupled to a column of flash memory cells in the memory array;
an address fault detection array comprising memory cells arranged in rows and columns, wherein each of the plurality of bit lines is coupled to a row in the address fault detection array; and
a comparator for comparing a column address received by the column decoder with a value output from the address fault detection array in response to an assertion of a bit line by the column decoder and for indicating a fault if the compared values are different and for indicating a fault in response to the assertion of multiple bit lines by the column decoder;
wherein for each "0" bit in a column address, the address fault detection array stores a value of "01," and for each "1" bit in a column address, the address fault detection array stores a value of "10".

29. A flash memory system, comprising:
a memory array comprising flash memory cells arranged in rows and columns;
a row decoder for receiving a row address as an input, the row decoder coupled to a plurality of word lines, wherein each word line is coupled to a row of flash memory cells in the memory array;
a column decoder for receiving a column address as an input, the column decoder coupled to a plurality of bit lines, wherein each bit line is coupled to a column of flash memory cells in the memory array;
an address fault detection array comprising memory cells arranged in rows and columns, wherein each of the plurality of word lines and each of the plurality of bit lines is coupled to a row in the address fault detection array;
a first comparator for comparing a row address received by the row decoder with a value output from the address fault detection array in response to the assertion of a word line by the row decoder and for indicating a fault if the compared values are different; and
a second comparator for comparing a column address received by the column decoder with a value output from the address fault detection array in response to the assertion of a bit line by the column decoder and for indicating a fault if the compared values are different.

30. The system of claim 29, wherein for each "0" bit in a row or column address, the address fault detection array stores a value of "01," and for each "1" bit in a row or column address, the address fault detection array stores a value of "10".

31. The system of claim 29, wherein for each "0" bit in a row or column address, the address fault detection array stores a value of "10," and for each "1" bit in a row or column address, the address fault detection array stores a value of "01".

32. The system of claim 29, wherein the address fault detection array comprises one or more source line transistors that pull one or more columns in the address fault detection array to ground during a power-down operation.

33. The system of claim 29, wherein the address fault detection array comprises a column of cells, wherein a first value in a cell indicates that bits in a row containing that cell were stored in an inverted manner and a second value in the cell indicates that bits in the row containing that cell were stored in a non-inverted manner.

34. The system of claim 29, wherein each flash memory cell in the memory array is a split gate flash memory cell.

35. The system of claim 29, wherein each memory cell in the address fault detection array is a split gate flash memory cell.

36. The system of claim 29, wherein each memory cell in the address fault detection array is a ROM cell.

37. The system of claim 29, wherein each flash memory cell in the memory array is programmed through a source side hot electron programming mechanism.

38. The system of claim 29, wherein each memory cell in the address fault detection array is a flash memory cell programmed through a source side hot electron programming mechanism.

39. The system of claim 29, wherein each flash memory cell in the memory array comprises a floating gate and an erase gate, wherein a top corner of the floating gate protrudes towards an inside corner of the erase gate to enhance erase efficiency.

40. The system of claim 29, wherein each memory cell in the address fault detection array is a flash memory cell comprising a floating gate and an erase gate, wherein a top corner of the floating gate protrudes towards an inside corner of the erase gate to enhance erase efficiency.

41. The system of claim 29, wherein for each flash memory cell in the memory array, an erased state in a flash memory cell represents a "1" value and a programmed state in a flash memory cell represents a "0" value.

42. The system of claim 29, wherein each memory cell in the address fault detection array is a flash memory cell and an erased state in the flash memory cells represents a "1" value and a programmed state in the flash memory cells represents a "0" value.

43. The system of claim 29, wherein the memory array and the address fault detection array are coupled to different control gate lines, erase gate lines, and source lines.

44. The system of claim 29, further comprising an analog comparator that indicates a fault if no rows have been selected.

45. The system of claim 29, further comprising an analog comparator that indicates no fault if one and only one row has been selected.

46. The system of claim 29, further comprising an analog comparator that indicates a fault if two or more rows have been selected.

47. The system of claim 29, further comprising a sensing circuit for reading data in the address fault detection array.

48. The system of claim 47, wherein the sensing circuit a differential sensing circuit.

49. The system of claim 47, wherein the sensing circuit is a single ended sensing circuit.

50. A flash memory system, comprising:
a memory array comprising flash memory cells arranged in rows and columns;
a row decoder for receiving a row address as an input, the row decoder coupled to a plurality of word lines, wherein each word line is coupled to a row of flash memory cells in the memory array;
a column decoder for receiving a column address as an input, the column decoder coupled to a plurality of bit lines, wherein each bit line is coupled to a column of flash memory cells in the memory array;
an address fault detection array comprising memory cells arranged in rows and columns, the columns comprising an indicator column, wherein each of the plurality of word lines and each of the plurality of bit lines is coupled to a row in the address fault detection array and each memory cell in the indicator column stores the same value;
a first comparator for comparing a row address received by the row decoder with a value output from the address fault detection array in response to the assertion of a word line by the row decoder and for indicating a fault if the compared values are different;
a second comparator for comparing a column address received by the column decoder with a value output from the address fault detection array in response to the assertion of a bit line by the column decoder and for indicating a fault if the compared values are different; and
a third comparator for comparing a current drawn by the indicator column with a reference current and for indicating a fault if the current drawn by the indicator column exceeds the reference current.

51. The system of claim 50, wherein for each "0" bit in a row or column address, the address fault detection array stores a value of "01," and for each "1" bit in a row or column address, the address fault detection array stores a value of "10".

52. The system of claim 50, wherein the address fault detection array comprises a column of cells, wherein a first value in a cell indicates that bits in a row containing that cell were stored in an inverted manner and a second value in the cell indicates that bits in the row containing that cell were stored in a non-inverted manner.

53. The system of claim 50, wherein the address fault detection array comprises a column of cells, each cell storing a '1' value.

54. The system of claim 50, wherein each flash memory cell in the memory array is a split gate flash memory cell.

55. The system of claim 50, wherein each memory cell in the address fault detection array is a ROM cell.

* * * * *